United States Patent
Ito et al.

(10) Patent No.: US 12,431,290 B2
(45) Date of Patent: Sep. 30, 2025

(54) SEMICONDUCTOR DEVICE AND MODULE

(71) Applicant: Murata Manufacturing Co., Ltd., Nagaokakyo (JP)

(72) Inventors: Korekiyo Ito, Nagaokakyo (JP); Masatomi Harada, Nagaokakyo (JP); Yuta Imamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 115 days.

(21) Appl. No.: 18/502,512

(22) Filed: Nov. 6, 2023

(65) Prior Publication Data

US 2024/0071687 A1 Feb. 29, 2024

Related U.S. Application Data

(63) Continuation of application No. PCT/JP2022/019612, filed on May 9, 2022.

(30) Foreign Application Priority Data

May 10, 2021 (JP) .................. 2021-079845

(51) Int. Cl.
*H01G 4/224* (2006.01)
*H01G 4/005* (2006.01)
(Continued)

(52) U.S. Cl.
CPC .......... *H01G 4/224* (2013.01); *H01G 4/005* (2013.01); *H01G 4/30* (2013.01); *H05K 1/181* (2013.01); *H05K 2201/10015* (2013.01)

(58) Field of Classification Search
CPC .......... H01G 4/224; H01G 4/005; H01G 4/30; H05K 1/181; H05K 2201/10015
See application file for complete search history.

(56) References Cited

U.S. PATENT DOCUMENTS 6,132,226 A * 10/2000 Noda ............... H05K 3/325
257/E21.511
8,410,536 B2 * 4/2013 Prymak ............ H01G 9/045
257/E23.079
(Continued)

FOREIGN PATENT DOCUMENTS

JP    S58157146 A    9/1983
JP    H0697173 A     4/1994
(Continued)

OTHER PUBLICATIONS

International Search Report in PCT/JP2022/019612, mailed Aug. 2, 2022, 4 pages.

*Primary Examiner* — Michael P Mcfadden
(74) *Attorney, Agent, or Firm* — ArentFox Schiff LLP

(57) ABSTRACT

A semiconductor device that includes: a substrate having a first main surface and a second main surface opposite to each other in a thickness direction; a circuit layer on the first main surface of the substrate, the circuit layer having a first electrode layer, a second electrode layer, a dielectric layer between the first electrode layer and the second electrode layer, a first outer electrode and a second outer electrode each extending to a surface of the circuit layer opposite to the substrate; and a first resin body at each of four corners of the substrate in a plan view in the thickness direction, and wherein, in the thickness direction, a top end of the first resin body on the side opposite to the substrate is positioned higher than top ends of the first outer electrode and the second outer electrode on the side opposite to the substrate.

18 Claims, 21 Drawing Sheets

(51) Int. Cl.
    *H01G 4/30*       (2006.01)
    *H05K 1/18*       (2006.01)

(56)           References Cited

U.S. PATENT DOCUMENTS

| | | | |
|---|---|---|---|
| 2004/0130849 A1* | 7/2004 | Kurihara | H01L 23/5223 |
| | | | 257/E27.048 |
| 2008/0164563 A1* | 7/2008 | Nomura | H10D 86/85 |
| | | | 257/532 |
| 2011/0317373 A1* | 12/2011 | McDermid | H05K 1/144 |
| | | | 361/736 |
| 2012/0024593 A1* | 2/2012 | Watanabe | H05K 3/368 |
| | | | 29/829 |
| 2012/0106032 A1* | 5/2012 | Prymak | H01G 9/045 |
| | | | 29/25.42 |

FOREIGN PATENT DOCUMENTS

| | | | | |
|---|---|---|---|---|
| JP | 2002208657 A | | 7/2002 | |
| JP | 2006210852 A | * | 8/2006 | ........... H05K 1/0271 |
| JP | 2007324418 A | | 12/2007 | |
| JP | 2012015299 A | | 1/2012 | |
| JP | 2012015333 A | | 1/2012 | |
| JP | 5445357 B2 | | 3/2014 | |
| JP | 2017220576 A | | 12/2017 | |

\* cited by examiner

SEMICONDUCTOR DEVICE AND MODULE

CROSS REFERENCE TO RELATED APPLICATIONS

The present application is a continuation of International application No. PCT/JP2022/019612, filed May 9, 2022, which claims priority to Japanese Patent Application No. 2021-079845, filed May 10, 2021, the entire contents of each of which are incorporated herein by reference.

TECHNICAL FIELD

The present invention relates to a semiconductor device and a module.

BACKGROUND ART

A metal-insulator-metal (MIM) capacitor, for example, is known as a typical capacitor element used in a semiconductor integrated circuit. The MIM capacitor is a capacitor having a parallel plate type structure in which an insulator is sandwiched by a lower electrode and an upper electrode.

Patent Document 1 discloses an electronic component including a circuit element formed on a substrate, at least one pair of terminal electrodes connected to the circuit element and disposed side by side on at least one surface, and a support body formed to protrude further than the at least one pair of terminal electrodes and provided in a region of the at least one surface not overlapping with the circuit element in plan view. Patent Document 1 describes, as an example of an electronic component, a capacitor in which a lower electrode, a dielectric layer, a first electrode, a first protection layer, a second electrode, a second protection layer, a terminal electrode, and a support body are laminated in this order on a substrate.

Patent Document 1: Japanese Patent No. 5445357

SUMMARY OF THE INVENTION

When an electronic component is mounted on an external substrate or the like using a surface mounting machine (mounter), a load is applied in a thickness direction of the electronic component at the time of mounting on the substrate. In a case that an excessive load is applied to the electronic component, the load becomes an impact force, and a circuit element formed in the electronic component may be damaged. With the use of the electronic component described in Patent Document 1, it is conceived that mechanical breakage of an electronic component which may occur at the time of mounting is prevented because a support body protrudes further than at least one pair of terminal electrodes disposed side by side. In other words, the support body is formed thicker than the at least one pair of terminal electrodes disposed side by side, and the support body receives, disperses, and alleviates a load applied from the outside.

However, in the electronic component described in Patent Document 1, insufficient effect of alleviating a load applied to a surface of an element at the time of mounting may cause a crack in a dielectric layer by the load transferred from the support body.

The present invention has been made to solve the above-described problem, and an object thereof is to provide a semiconductor device in which concentration of a load on a dielectric layer is prevented. Another object of the present invention is to provide a module including the semiconductor device above.

The semiconductor device according to a preferred embodiment of the present invention includes: a substrate having a first main surface and a second main surface opposite to each other in a thickness direction; a circuit layer on the first main surface of the substrate, wherein the circuit layer has a first electrode layer adjacent to the substrate, a second electrode layer facing the first electrode layer, a dielectric layer between the first electrode layer and the second electrode layer in the thickness direction, a first outer electrode extending to a surface of the circuit layer opposite to the substrate, and a second outer electrode extending to the surface of the circuit layer opposite to the substrate and separated from the first outer electrode; and a first resin body at each of four corners of the substrate in the plan view in the thickness direction, and wherein, in the thickness direction, a top end of the first resin body on the side opposite to the substrate is positioned higher than top ends of the first outer electrode and the second outer electrode on the side opposite to the substrate.

The module of a preferred embodiment of the present invention includes: the semiconductor device; and a wiring substrate having a first land electrically connected to the first outer electrode and a second land electrically connected to the second outer electrode.

According to aspects of the present invention, it is possible to provide a semiconductor device in which concentration of a load on a dielectric layer is prevented. Further, according to aspects of the present invention, a module including the semiconductor device above may be provided.

BRIEF DESCRIPTION OF THE DRAWINGS

FIG. 1-2 is a schematic side view of the capacitor illustrated in FIG. 1-1.

FIG. 1-3 is a schematic sectional view of a portion corresponding to a line segment A1-A2 in FIG. 1-1.

FIG. 2-1 is a schematic plan view of the capacitor according to Embodiment 1 of the present invention illustrating a first modification thereof.

FIG. 2-2 is a schematic side view of the capacitor illustrated in FIG. 2-1.

FIG. 2-3 is a schematic sectional view of a portion corresponding to a line segment A1-A2 in FIG. 2-1.

FIG. 3-1 is a schematic plan view of the capacitor according to Embodiment 1 of the present invention illustrating a second modification thereof.

FIG. 3-2 is a schematic side view of the capacitor illustrated in FIG. 3-1.

FIG. 3-3 is a schematic sectional view of a portion corresponding to a line segment A1-A2 in FIG. 3-1.

FIG. 4-1 is a schematic plan view of the capacitor according to Embodiment 1 of the present invention illustrating a third modification thereof.

FIG. 4-2 is a schematic side view of the capacitor illustrated in FIG. 4-1.

FIG. 4-3 is a schematic sectional view of a portion corresponding to a line segment A1-A2 in FIG. 4-1.

FIG. 5-1 is a schematic sectional view for explaining an example of a process of forming an insulation layer.

FIG. 5-2 is a schematic sectional view for explaining an example of a process of forming a first electrode layer.

FIG. 5-3 is a schematic sectional view for explaining an example of a process of forming a dielectric layer.

FIG. 5-4 is a schematic sectional view for explaining an example of a process of forming a second electrode layer.

FIG. 5-5 is a schematic sectional view for explaining an example of a process of forming a moisture-resistant protection layer.

FIG. 5-6 is a schematic sectional view for explaining an example of a process of forming a resin protection layer.

FIG. 5-7 is a schematic sectional view for explaining an example of a process of forming a seed layer.

FIG. 5-8 is a schematic sectional view for explaining an example of a process of forming a first plating layer and a second plating layer.

FIG. 5-9 is a schematic sectional view for explaining an example of a process of removing part of the seed layer.

FIG. 5-10 is a schematic sectional view for explaining an example of a process of forming a photosensitive resin film.

FIG. 5-11 is a schematic sectional view for explaining an example of a process of forming a first resin body and a second resin body.

FIG. 6 is a schematic sectional view of a module according to Embodiment 1 of the present invention.

FIG. 7 is a schematic sectional view of the module according to Embodiment 1 of the present invention illustrating a state that a mold resin is provided.

FIG. 8-1 is a schematic plan view of a capacitor according to Embodiment 2 of the present invention illustrating an example thereof.

FIG. 8-2 is a schematic sectional view of a portion corresponding to a line segment A1-A2 in FIG. 8-1.

FIG. 8-3 is a schematic side view of the capacitor illustrated in FIG. 8-1.

FIG. 9-1 is a schematic plan view of the capacitor according to Embodiment 2 of the present invention illustrating a modification thereof.

FIG. 9-2 is a schematic sectional view of a portion corresponding to a line segment A1-A2 in FIG. 9-1.

FIG. 9-3 is a schematic side view of the capacitor illustrated in FIG. 9-1.

FIG. 10-1 is a schematic plan view of a capacitor according to Embodiment 3 of the present invention illustrating an example thereof.

FIG. 10-2 is a schematic side view of the capacitor illustrated in FIG. 10-1.

FIG. 10-3 is a schematic sectional view of a portion corresponding to a line segment A1-A2 in FIG. 10-1.

FIG. 11-1 is a schematic plan view of the capacitor according to Embodiment 3 of the present invention illustrating a modification thereof.

FIG. 11-2 is a schematic side view of the capacitor illustrated in FIG. 11-1.

FIG. 11-3 is a schematic sectional view of a portion corresponding to a line segment A1-A2 in FIG. 11-1.

FIG. 12-1 is a schematic plan view of a capacitor according to Embodiment 4 of the present invention illustrating an example thereof.

FIG. 12-2 is a schematic side view of the capacitor illustrated in FIG. 12-1.

FIG. 12-3 is a schematic sectional view of a portion corresponding to a line segment A1-A2 in FIG. 12-1.

FIG. 13-1 is a schematic plan view of a capacitor according to Embodiment 5 of the present invention illustrating an example thereof.

FIG. 13-2 is a schematic side view of the capacitor illustrated in FIG. 13-1.

FIG. 13-3 is a schematic sectional view of a portion corresponding to a line segment A1-A2 in FIG. 13-1.

FIG. 14-1 is a schematic plan view of the capacitor according to Embodiment 5 of the present invention illustrating a modification thereof.

FIG. 14-2 is a schematic side view of the capacitor illustrated in FIG. 14-1.

FIG. 14-3 is a schematic sectional view of a portion corresponding to a line segment A1-A2 in FIG. 14-1.

DETAILED DESCRIPTION OF THE PREFERRED EMBODIMENTS

Hereinafter, a semiconductor device and a module according to preferred aspects of the present invention will be described.

However, the present invention is not limited to the following configuration, and can be appropriately modified and applied within a range not changing the gist of the present invention. Combinations of two or more of the individual preferred configurations of the present invention described below are also included in the present invention.

Each embodiment described below is an example, and it is needless to say that partial replacement or combination of configurations described in different embodiments is possible. In the second and subsequent embodiments, descriptions of matters common to those in Embodiment 1 will be omitted, and only different points will be described. In particular, similar functions and effects obtained in a similar configuration will not be described in each embodiment.

In the following description, when the embodiments are not particularly distinguished from each other, they are simply referred to as "semiconductor device of the present invention" and "module of the present invention". The shape, arrangement, and the like of the semiconductor device, the module, and each constituent element of the present invention are not limited to the illustrated examples.

In the following description, a capacitor will be taken as an example of an embodiment of the semiconductor device according to the present invention. The semiconductor device according to the present invention may be a capacitor itself (that is, a capacitor element), or may be a device including a capacitor.

Embodiment 1

A semiconductor device in accordance with an exemplary embodiment of the present invention includes: a substrate, a circuit layer, and a first resin body. The first resin body is provided at each of four corners of the substrate in a plan view in a thickness direction, and in the thickness direction, a top end of the first resin body on a side opposite to the substrate is positioned higher than top ends of a first outer electrode and a second outer electrode on the side opposite to the substrate. The semiconductor device may further include a second resin body. In the case above, the second resin body is provided between the first outer electrode and the second outer electrode in the plan view in the thickness direction, and in the thickness direction, a top end of the second resin body on the side opposite to the substrate is positioned higher than the top ends of the first outer electrode and the second outer electrode on the side opposite to the substrate and is positioned higher than the top end of the first resin body on the side opposite to the substrate. Such an example will be described below as a capacitor according to Embodiment 1 of the present invention.

Figure 1:
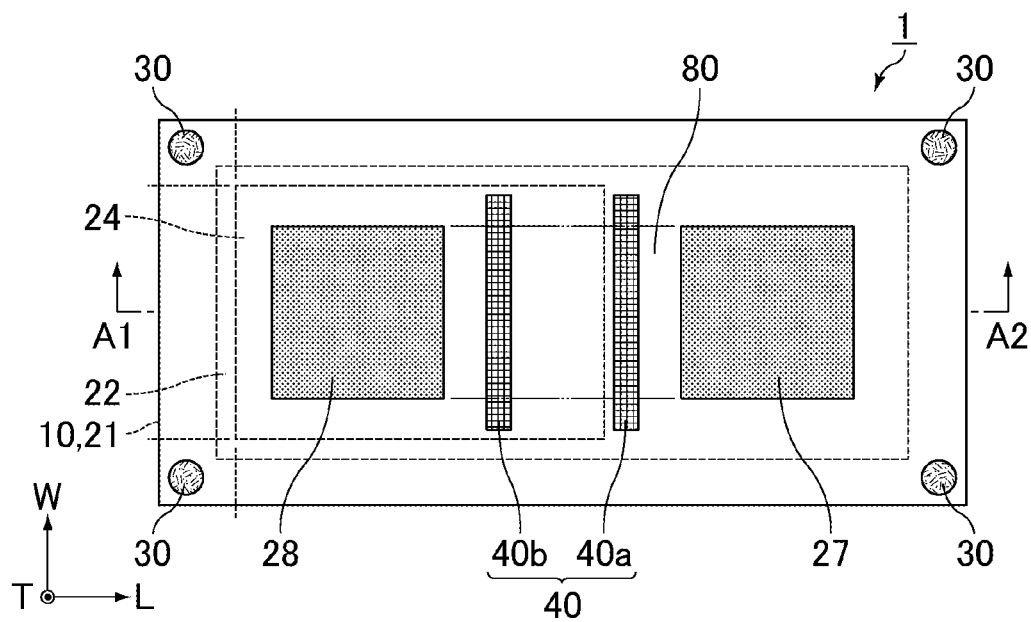
FIG. 1-1 is a schematic plan view of a capacitor according to Embodiment 1 of the present invention illustrating an example thereof.
Figures 1, 2:
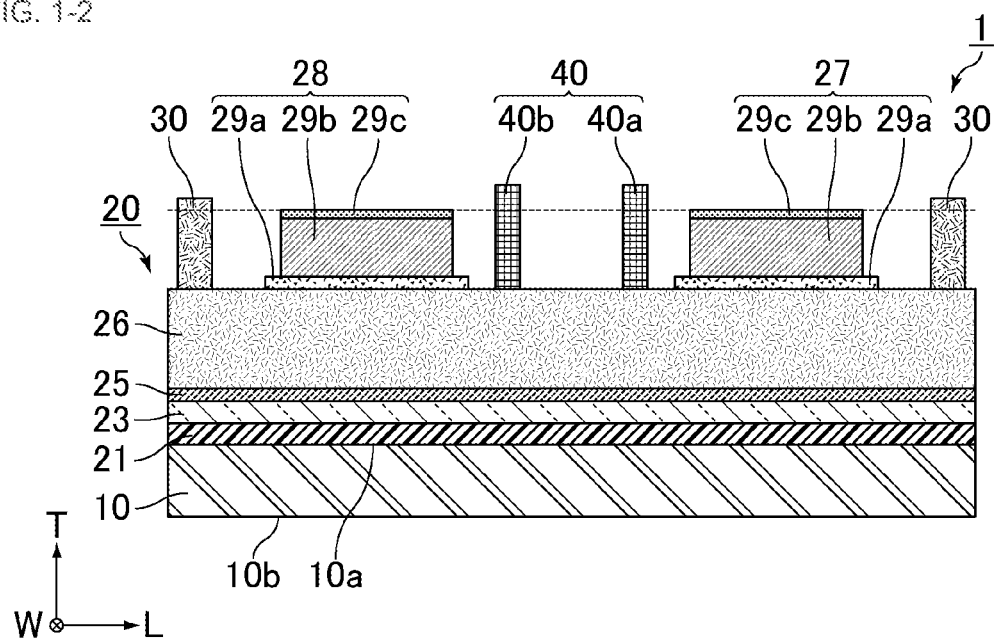
Figures 1, 2, 3:
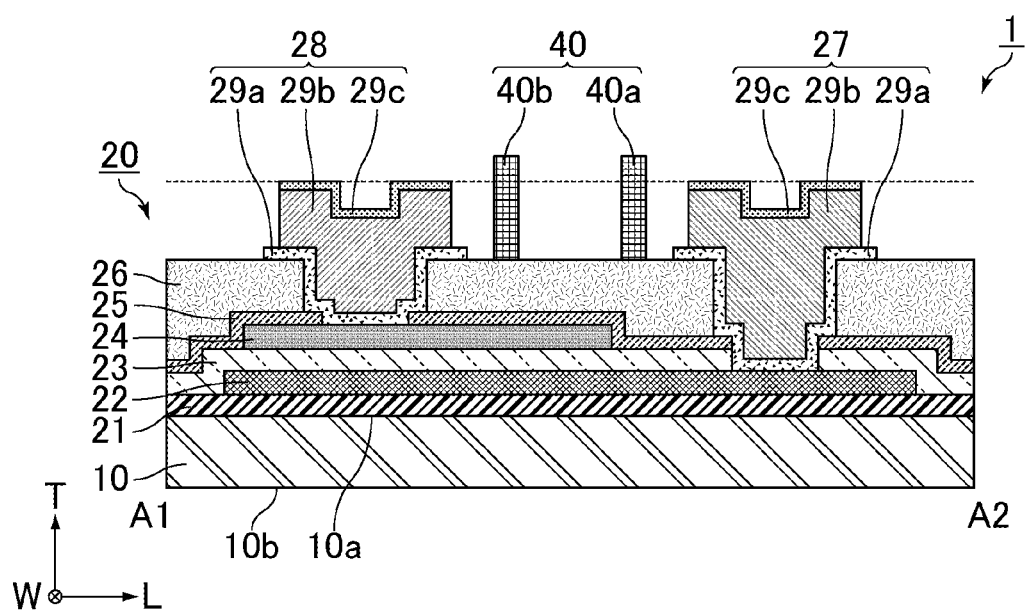
Figures 1, 2:
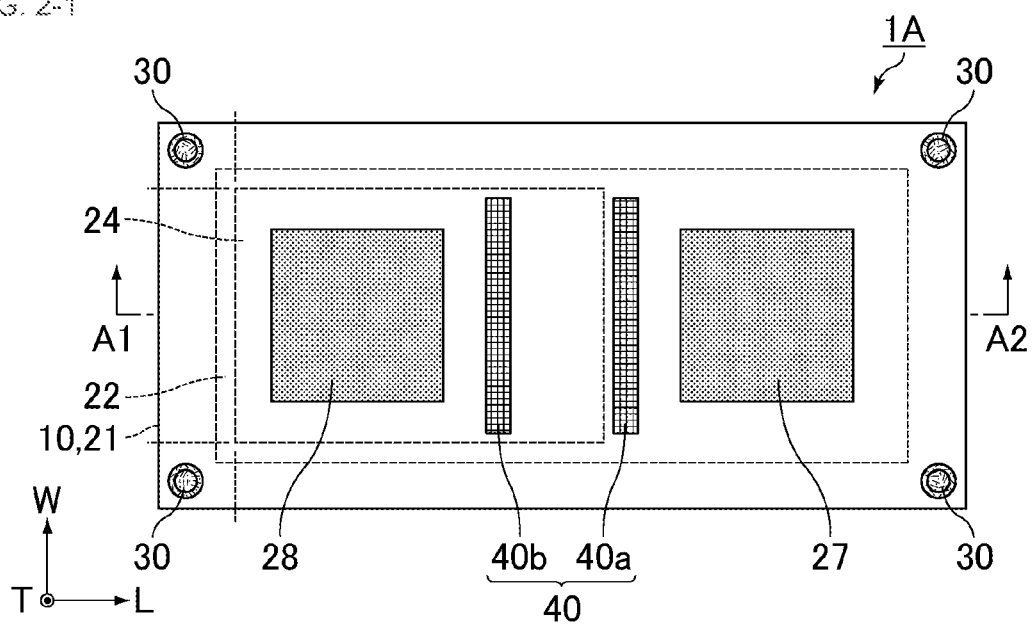
Figure 2:
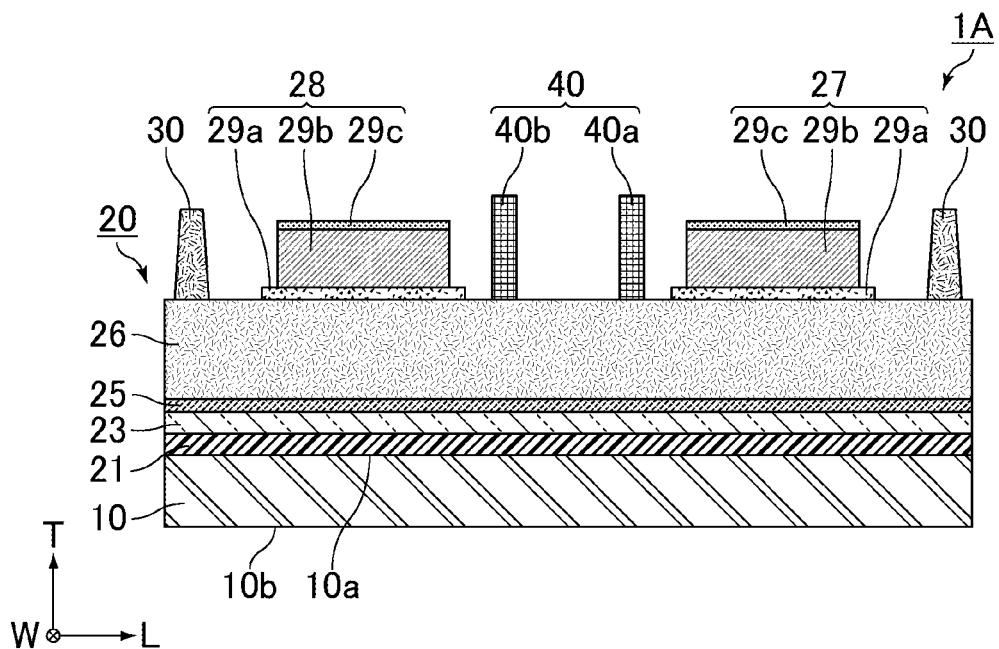
Figures 2, 3:
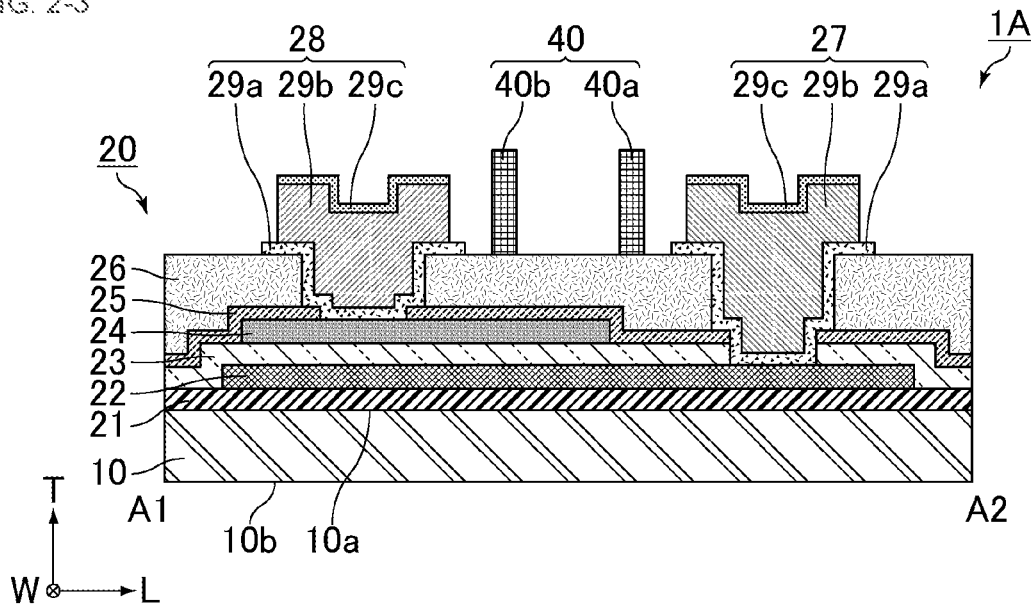
Figures 1, 3:
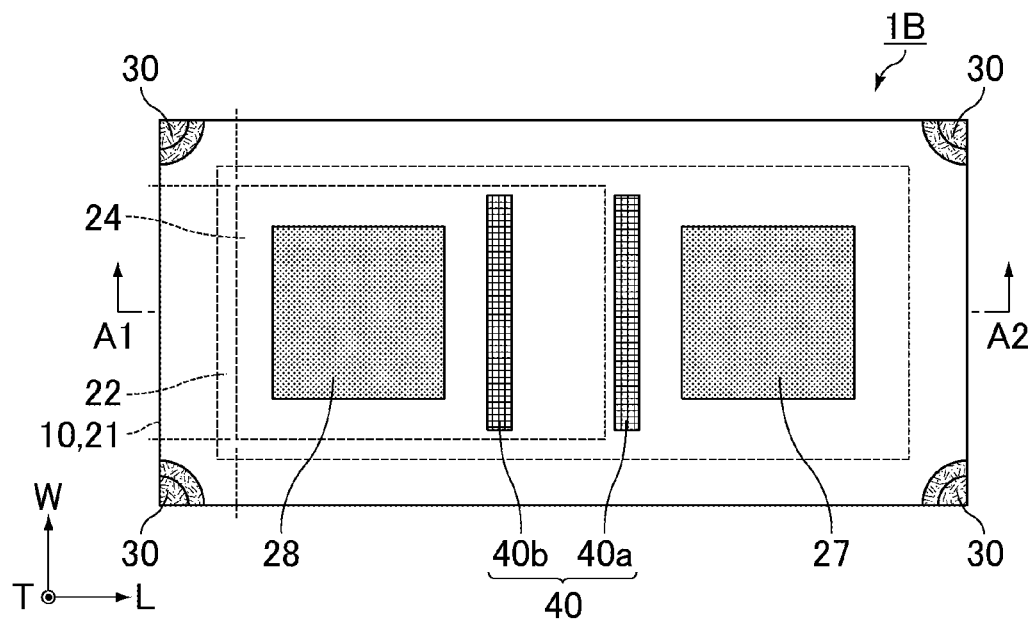
Figures 2, 3:
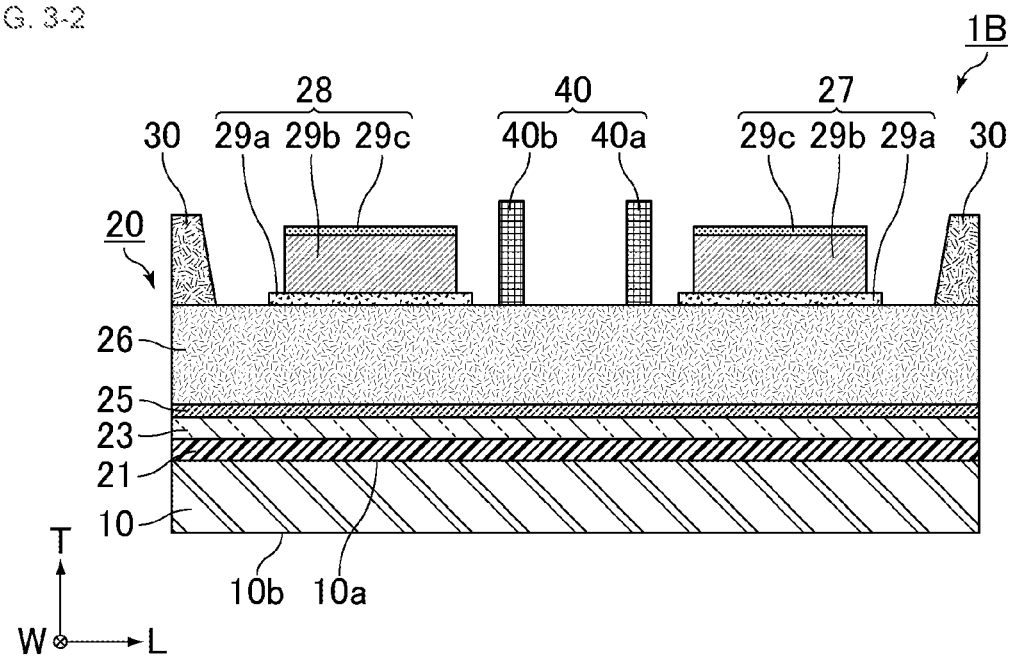
Figure 3:
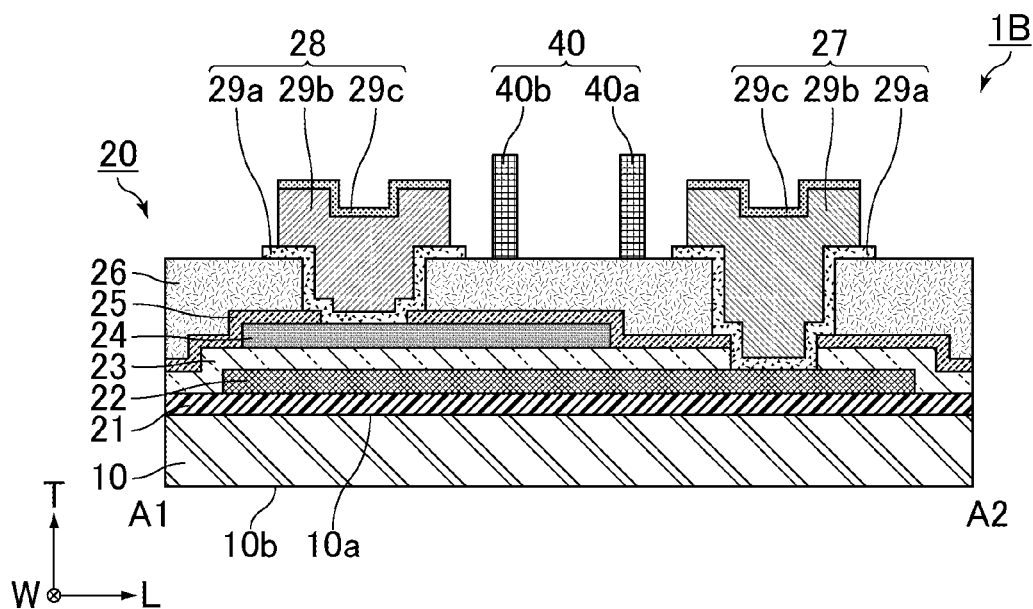

FIG. 1-1 is a schematic plan view of the capacitor according to Embodiment 1 of the present invention illustrating an example thereof. FIG. 1-2 is a schematic side view of the capacitor illustrated in FIG. 1-1. FIG. 1-3 is a schematic sectional view of a portion corresponding to a line segment A1-A2 in FIG. 1-1.

In the present description, a length direction, a width direction, and a thickness direction of a capacitor (semiconductor device) are defined as directions defined by an arrow L, an arrow W, and an arrow T, respectively, as illustrated in FIG. 1-1, FIG. 1-2, FIG. 1-3, or the like. Here, a length direction L, a width direction W, and a thickness direction T are orthogonal to each other.

As illustrated in FIG. 1-1, FIG. 1-2, and FIG. 1-3, a capacitor 1 includes a substrate 10, a circuit layer 20, a first resin body 30, and a second resin body 40.

The substrate 10 has a first main surface 10a and a second main surface 10b opposite to each other in the thickness direction T. The first main surface 10a and the second main surface 10b are opposed to each other in the thickness direction T.

Examples of the constituent material of the substrate 10 include semiconductors such as silicon (Si), silicon germanium (SiGe), and gallium arsenide (GaAs).

The electrical resistivity of the substrate 10 is preferably $10^{-1}$ Ω·cm to $10^6$ Ω·cm.

A measurement of the substrate 10 in the length direction L is preferably 200 μm to 600 μm.

A measurement of the substrate 10 in the width direction W is preferably 100 μm to 300 μm.

A measurement (thickness) of the substrate 10 in the thickness direction T is preferably 50 μm to 250 μm.

The circuit layer 20 is provided on the first main surface 10a of the substrate 10. The circuit layer 20 includes an insulation layer 21, a first electrode layer 22, a dielectric layer 23, a second electrode layer 24, a moisture-resistant protection layer 25, a resin protection layer 26, a first outer electrode 27, and a second outer electrode 28. Although the circuit layer 20 is provided on the entire first main surface 10a of the substrate 10 in Embodiment 1, the circuit layer 20 may be provided on part of the first main surface 10a of the substrate 10. In the case above, the circuit layer 20 is preferably provided in a center position on the first main surface 10a of the substrate 10, and is preferably provided at a position where a center axis of the substrate 10 and a center axis of the circuit layer 20 substantially coincide with each other.

A measurement of the circuit layer 20 in the thickness direction T is preferably 5 μm to 70 μm. The measurement of the circuit layer 20 in the thickness direction T is determined by a measurement from a surface of the insulation layer 21 on a side close to the substrate 10 to the furthest surface positioned on a side opposite to the substrate 10 out of outermost surfaces of the first outer electrode 27 and the second outer electrode 28.

The insulation layer 21 is provided on the entire first main surface 10a of the substrate 10. Although the insulation layer 21 may be provided on part of the first main surface 10a of the substrate 10, the insulation layer 21 needs to be provided in a region larger than the first electrode layer 22 and overlapping with the entire area of the first electrode layer 22. For example, the insulation layer 21 can be provided on part of the first main surface 10a of the substrate 10 by forming an insulation layer on the entire first main surface 10a of the substrate 10, and then removing part of the insulation layer with an etching method. The insulation layer is formed on the entire first main surface 10a of the substrate 10 by oxidizing the first main surface 10a of the substrate 10 with a thermal-oxidizing method or depositing a film with a sputtering method or a chemical vapor deposition (CVD) method.

Examples of the constituent material of the insulation layer 21 include silicon oxide (SiO, $SiO_2$), silicon nitride (SiN), aluminum oxide ($Al_2O_3$), hafnium oxide ($HfO_2$), tantalum oxide ($Ta_2O_5$), and zirconium oxide ($ZrO_2$).

The insulation layer 21 may have a single-layer structure or a multilayer structure including a plurality of layers made of the above-described materials.

A measurement (thickness) of the insulation layer 21 in the thickness direction T is preferably 0.5 μm to 3 μm.

The first electrode layer 22 is provided on a surface of the circuit layer 20 on the side thereof adjacent to the substrate 10, e.g., on the surface of the insulation layer 21 on the side opposite to the substrate 10. The first electrode layer 22 is provided inside a position separated from an end portion of the substrate 10. More specifically, an end portion of the first electrode layer 22 is positioned at an inside of the end portion of the substrate 10. In plan view in FIG. 1-1, a distance between the end portion of the first electrode layer 22 and the end portion of the substrate 10 is preferably 5 μm to 30 μm. The end portion of the first electrode layer 22 may be provided on the surface of the insulation layer 21 up to the end portion of the substrate 10.

Examples of the constituent material of the first electrode layer 22 include metals such as aluminum (Al), silicon (Si), copper (Cu), silver (Ag), gold (Au), nickel (Ni), chromium (Cr), and titanium (Ti). The constituent material of the first electrode layer 22 may be an alloy containing at least one of the above-described metals, and specific examples thereof include an aluminum-silicon alloy (AlSi), an aluminum-copper alloy (AlCu), and an aluminum-silicon-copper alloy (AlSiCu).

The first electrode layer 22 may have a single-layer structure or a multilayer structure including a plurality of conductor layers made of the above-described materials.

A measurement (thickness) of the first electrode layer 22 in the thickness direction T is preferably 0.3 μm to 10 μm, and more preferably 0.5 μm to 5 μm.

The dielectric layer 23 is provided between the first electrode layer 22 and the second electrode layer 24 in the thickness direction T, that is, in a direction orthogonal to the first main surface 10a of the substrate 10. The dielectric layer 23 is provided so as to cover the first electrode layer 22 except for an opening, and an end portion of the dielectric layer 23 is provided on the surface of the insulation layer 21 from the end portion of the first electrode layer 22 to the end portion of the substrate 10 as well.

Examples of the constituent material of the dielectric layer 23 include silicon nitride (SiN), silicon oxide (SiO, $SiO_2$), aluminum oxide ($Al_2O_3$), hafnium oxide ($HfO_2$), tantalum oxide ($Ta_2O_5$), and zirconium oxide ($ZrO_2$). In particular, the dielectric layer 23 preferably includes at least one of silicon nitride and silicon oxide.

A measurement (thickness) of the dielectric layer 23 in the thickness direction T is preferably 0.02 μm to 4 μm.

The second electrode layer 24 is provided to face the first electrode layer 22. More specifically, the second electrode layer 24 is provided on a surface of the dielectric layer 23 on the side opposite to the substrate 10, and faces the first electrode layer 22 with the dielectric layer 23 interposed therebetween.

Examples of the constituent material of the second electrode layer 24 include metals such as aluminum (Al), silicon (Si), copper (Cu), silver (Ag), gold (Au), nickel (Ni), chromium (Cr), and titanium (Ti). The constituent material of the second electrode layer 24 may be an alloy containing at least one of the above-described metals, and specific examples thereof include an aluminum-silicon alloy (AlSi), an aluminum-copper alloy (AlCu), and an aluminum-silicon-copper alloy (AlSiCu).

The second electrode layer 24 may have a single-layer structure or a multilayer structure including a plurality of conductor layers made of the above-described materials.

A measurement (thickness) of the second electrode layer 24 in the thickness direction T is preferably 0.3 µm to 10 µm, and more preferably 0.5 µm to 5 µm.

The first electrode layer 22, the dielectric layer 23, and the second electrode layer 24 constitute a capacitor element. More specifically, capacitance of the capacitor element is formed in a region where the first electrode layer 22, the dielectric layer 23, and the second electrode layer 24 overlap with each other.

The moisture-resistant protection layer 25 is provided so as to cover the dielectric layer 23 and the second electrode layer 24 except for an opening. Providing the moisture-resistant protection layer 25 enhances a moisture resistant property of the capacitor element, in particular, of the dielectric layer 23.

Examples of the constituent material of the moisture-resistant protection layer 25 include silicon nitride (SiN) and silicon oxide ($SiO_2$). Although each film may be provided as a single layer, silicon nitride is preferable because it has a higher moisture resistant property. Furthermore, by laminating silicon nitride and silicon oxide in this order from a lower side (a side close to the substrate 10), the moisture resistant property inside the element may be increased by silicon nitride, and the silicon oxide having a small Young's modulus and a small film stress may disperse the concentration of impact transferred from the first resin body 30 via the substrate 10 to an end portion of the second electrode layer 24 at the time of mounting.

A measurement (thickness) of the moisture-resistant protection layer 25 in the thickness direction T is preferably 0.5 µm to 3 µm.

The resin protection layer 26 is provided so as to cover the first electrode layer 22 and the second electrode layer 24. Here, the resin protection layer 26 is provided on a surface of the moisture-resistant protection layer 25 on the side opposite to the substrate 10. Further, the resin protection layer 26 is provided to extend up to the end portion of the substrate 10, and is provided with openings at respective positions below. The first position overlaps with the openings of the dielectric layer 23 and the moisture-resistant protection layer 25 (openings overlapping with the first electrode layer 22), and the second position overlaps with the opening of the moisture-resistant protection layer 25 (opening overlapping with the second electrode layer 24). Providing the resin protection layer 26 enables the capacitor element, in particular, the dielectric layer 23 to be sufficiently protected from moisture.

Examples of the constituent material of the resin protection layer 26 include resins such as a polyimide resin, a polybenzoxazole resin, a benzocyclobutene resin, and a resin in a solder resist.

A measurement (thickness) of the resin protection layer 26 in the thickness direction T is preferably 1 µm to 20 µm.

The first outer electrode 27 extends to the surface of the circuit layer 20 on the side opposite to the substrate 10, and is separated from the second outer electrode 28. That is, the first outer electrode 27 is positioned on the first electrode layer 22 on the side opposite to the substrate 10. Here, the first outer electrode 27 is electrically connected to the first electrode layer 22. More specifically, the openings provided to the respective dielectric layer 23, moisture-resistant protection layer 25, and resin protection layer 26 are communicated with each other along the thickness direction T to extend, and the first outer electrode 27 is electrically connected to the first electrode layer 22 through the openings. Further, the first outer electrode 27 is separated from the second electrode layer 24 in a plane along the length direction L and the width direction W (see FIG. 1-1), and thus the first outer electrode 27 is not electrically connected to the second electrode layer 24.

The first outer electrode 27 may have a single-layer structure or a multilayer structure.

When the first outer electrode 27 has a single-layer structure, examples of the constituent material thereof include gold (Au), silver (Ag), copper (Cu), palladium (Pd), nickel (Ni), titanium (Ti), aluminum (Al), and an alloy containing at least one of these metals.

When the first outer electrode 27 has a multilayer structure, the first outer electrode 27 may include a seed layer 29a, a first plating layer 29b, and a second plating layer 29c in this order from the side close to the substrate 10 as illustrated in FIG. 1-2 and FIG. 1-3.

Examples of the seed layer 29a of the first outer electrode 27 include a multilayer body (Ti/Cu) of a conductor layer made of titanium (Ti) and a conductor layer made of copper (Cu).

Examples of the constituent material of the first plating layer 29b of the first outer electrode 27 include nickel (Ni).

Examples of the constituent material of the second plating layer 29c of the first outer electrode 27 include gold (Au) and tin (Sn).

The second outer electrode 28 extends to the surface of the circuit layer 20 on the side opposite to the substrate 10 and is separated from the first outer electrode 27. That is, the second outer electrode 28 is positioned on the second electrode layer 24 on the side opposite to the substrate 10. Here, the second outer electrode 28 is electrically connected to the second electrode layer 24. More specifically, the openings provided in the respective moisture-resistant protection layer 25 and resin protection layer 26 are communicated with each other along the thickness direction T to extend, and the second outer electrode 28 is electrically connected to the second electrode layer 24 through the openings. The second outer electrode 28 is separated from the first electrode layer 22 in a plane along the length direction L and the thickness direction T (see FIG. 1-3), and thus the second outer electrode 28 is not electrically connected to the first electrode layer 22.

The second outer electrode 28 may have a single-layer structure or a multilayer structure.

When the second outer electrode 28 has a single-layer structure, examples of the constituent material thereof include gold (Au), silver (Ag), copper (Cu), palladium (Pd), nickel (Ni), titanium (Ti), aluminum (Al), and an alloy containing at least one of these metals.

When the second outer electrode 28 has a multilayer structure, the second outer electrode 28 may include a seed layer 29a, a first plating layer 29b, and a second plating layer 29c in this order from the side close to the substrate 10 as illustrated in FIG. 1-2 and FIG. 1-3.

Examples of the seed layer 29a of the second outer electrode 28 include a multilayer body (Ti/Cu) of a conductor layer made of titanium (Ti) and a conductor layer made of copper (Cu).

Examples of the constituent material of the first plating layer 29b of the second outer electrode 28 include nickel (Ni).

Examples of the constituent material of the second plating layer 29c of the second outer electrode 28 include gold (Au) and tin (Sn).

The constituent material of the first outer electrode 27 and the constituent material of the second outer electrode 28 may be the same as or different from each other.

As illustrated in FIG. 1-1, the first resin body 30 is provided at each of four corners of the substrate 10 in plan view in the thickness direction T. More specifically, in plan view in the thickness direction T, the first resin body 30 is provided at a position where a distance between all places on the uppermost surface of the first resin body 30 and a corner portion of a capacitor element (corner portion of the substrate 10) is shorter than the shortest distance between the end portion of the second electrode layer 24 and an outer periphery of the capacitor element (outer periphery of the substrate 10). That is, the first resin body 30 is provided in a range not exceeding dotted lines extending from the end portion of the second electrode layer 24 in plan view illustrated in FIG. 1-1. Here, the first resin body 30 is provided on the surface of the circuit layer 20 on the side opposite to the substrate 10.

As illustrated in FIG. 1-2, in the thickness direction T, a top end of the first resin body 30 on the side opposite to the substrate 10 is positioned higher than top ends of the first outer electrode 27 and the second outer electrode 28 on the side opposite to the substrate 10. More specifically, in the thickness direction T, the top end of the first resin body 30 on the side opposite to the substrate 10 is positioned on the side opposite to the substrate 10 relative to a line segment (dotted line in FIG. 1-2) that connects the top ends of the first outer electrode 27 and the second outer electrode 28 on the side opposite to the substrate 10.

As illustrated in FIG. 1-1, the second resin body 40 is provided between the first outer electrode 27 and the second outer electrode 28 in plan view in the thickness direction T. More specifically, the second resin body 40 is provided, in the length direction L, between a normal line extending along the width direction W from an end portion of the first outer electrode 27 on a side close to the second outer electrode 28 and a normal line extending along the width direction W from an end portion of the second outer electrode 28 on a side close to the first outer electrode 27. Here, the second resin body 40 is provided on the surface of the circuit layer 20 on the side opposite to the substrate 10.

As illustrated in FIG. 1-3, in the thickness direction T, a top end of the second resin body 40 on the side opposite to the substrate 10 is positioned higher than the top ends of the first outer electrode 27 and the second outer electrode 28 on the side opposite to the substrate 10. More specifically, in the thickness direction T, the top end of the second resin body 40 on the side opposite to the substrate 10 is positioned further on the side opposite to the substrate 10 than a line segment (dotted line in FIG. 1-3) that connects the top ends of the first outer electrode 27 and the second outer electrode 28 on the side opposite to the substrate 10.

The outermost surface of the first outer electrode 27 has an uneven shape in FIG. 1-3, and in this case, in the thickness direction T, a portion positioned furthest on the side opposite to the substrate 10 in the outermost surface of the first outer electrode 27 is defined as the top end of the first outer electrode 27 on the side opposite to the substrate 10. The same applies to the second outer electrode 28.

As illustrated in FIG. 1-2, in the thickness direction T, the top end of the second resin body 40 on the side opposite to the substrate 10 is positioned higher than the top end of the first resin body 30 on the side opposite to the substrate 10.

Here, as described above, since the first electrode layer 22 is provided inside a position separated from the end portion of the substrate 10, the circuit layer 20 tends to be lowered toward the substrate 10 in an end portion (peripheral portion) than in a center portion. In the sectional view illustrated in FIG. 1-3, although the resin protection layer 26 is provided on the end portion of the substrate 10, the first electrode layer 22 and the second electrode layer 24 are not present below the resin protective layer 26, and thus the resin protection layer 26 is less likely to increase in thickness in an actual case. This also makes the circuit layer 20 tend to be lowered toward the substrate 10 in the end portion (peripheral portion) than in the center portion. Thus, in the first outer electrode 27 and the second outer electrode 28, the circuit layer 20 tends to be positioned higher in a side close to the center portion than in a side close to the end portion. Meanwhile, in plan view illustrated in FIG. 1-1, the second resin body 40 is provided between the first outer electrode 27 and the second outer electrode 28, that is, in the vicinity of the center portion of the circuit layer 20, not in the end portion thereof. As described above, in a sectional view illustrated in FIG. 1-3, the top end of the second resin body 40 on the side opposite to the substrate 10 is positioned higher than the top ends of the first outer electrode 27 and the second outer electrode 28 on the side opposite to the substrate 10. Thus, even in a state that the circuit layer 20 is lowered toward the substrate 10 in the end portion than in the center portion, the second resin body 40 protrudes further than the circuit layer 20.

Since the first resin body 30 protrudes further than the circuit layer 20 and the second resin body 40 protrudes further than the first resin body 30, when the capacitor 1 is mounted on a wiring substrate, for example, the second resin body 40 comes into contact with the wiring substrate side (an upper surface of the wiring substrate, a land, solder, or the like, for example) before the first resin body 30, the first outer electrode 27 and the second outer electrode 28 come into contact with the wiring substrate. Thus, a load is applied to the second resin body 40, and a load applied to the first resin body 30, the first outer electrode 27 and the second outer electrode 28 is reduced. As a result, a load transfer to the capacitor element via the first outer electrode 27 and the second outer electrode 28 is prevented, and thus breakage of the capacitor element, in particular, breakage of the dielectric layer 23 is prevented. When the mounting speed is increased, however, the variation of the load increases, and then, receiving the entire load only by the second resin body 40 may cause the stress applied to the dielectric layer 23 immediately below the second resin body 40 to increase and the dielectric layer 23 may be broken. Therefore, by making the first resin body 30 higher than the height of the second resin body 40 at the time of being deformed and lowered by the load, the load is dispersed to the first resin body 30 before the stress reaches a level at which the dielectric layer 23 immediately below the second resin body 40 is broken. Since the load applied to the first resin body 30 is concentrated on the corner portion of the substrate 10 immediately below the first resin body 30, breakage of the dielectric layer 23 is prevented. Such an effect is similarly obtained when the capacitor 1 is mounted on a flat plate with a side close to the circuit layer 20 as a bottom.

When the first resin body 30 is provided at a position other than the four corners of the substrate 10 in plan view, a load at the time of mounting is transferred to the second electrode layer 24 via the substrate 10, stress is concentrated on the end portion of the second electrode layer 24, and the dielectric layer 23 immediately below the end portion is broken. Meanwhile, providing the first resin body 30 only at each of the four corners of the substrate 10 in plan view makes the stress be concentrated on the substrate 10 immediately below the first resin body 30, and thus breakage of the dielectric layer 23 is prevented. In a case of the structure in which the second electrode layer 24 is disposed closer to the left side as illustrated in FIG. 1-3, the first resin body 30 provided at each of the two corner portions of the substrate 10 closer to the second electrode layer 24 is made lower in height than the first resin body 30 provided at each of the two corner portions of the substrate 10 farther from the second electrode layer 24. Thus, the first resin body 30 provided at each of the two corner portions of the substrate 10 farther from the second electrode layer 24 receives the load earlier, but, since the end portion of the second electrode layer 24 to which the stress tends to concentrate is not present, breakage due to the load is further prevented.

As illustrated in FIG. 1-1, in plan view in the thickness direction T, the first resin body 30 is preferably provided at a position not overlapping with the first electrode layer 22. With the configuration above, a load transfer from the first resin body 30 to the second resin body 40 may further be prevented.

It is preferable that the second resin body 40 be provided at a position surrounding a center of the substrate 10. As illustrated in FIG. 1-1, FIG. 1-2, and FIG. 1-3, the second resin body 40 preferably extends in a direction orthogonal to the thickness direction T, and in a direction intersecting with a direction, here the length direction L, from the second outer electrode 28 toward the first outer electrode 27. More specifically, the second resin body 40 preferably extends in a direction orthogonal to both the length direction L and the thickness direction T, that is, extends in the width direction W.

In FIG. 1-1, FIG. 1-2, and FIG. 1-3, the second resin body 40 includes a first wall portion 40a provided on the side close to the first outer electrode 27, and a second wall portion 40b provided on the side close to the second outer electrode 28 and separated from the first wall portion 40a.

As illustrated in FIG. 1-1, it is preferable that the first wall portion 40a and the second wall portion 40b be provided in parallel. In the case above, when the capacitor 1 is mounted on a wiring substrate, for example, the substrate 10 and the circuit layer 20 may sufficiently stably be held on the wiring substrate by the second resin body 40. In particular, since the first wall portion 40a is provided on one side with respect to the center of the substrate 10 in the length direction L and the second wall portion 40b is provided on the other side, the substrate 10 and the circuit layer 20 may more stably be held on the wiring substrate by the second resin body 40.

In plan view illustrated in FIG. 1-1, the second resin body 40 extends in a region 80 that is a region connecting the end portions of the first outer electrode 27 and the second outer electrode 28 facing each other. The top end of the second resin body 40 is positioned higher than the top end of the first resin body 30 and a top end of the circuit layer 20. With the configuration above, at the time of mounting the capacitor 1 on a wiring substrate to form a module, when solder spreads out, that is, when a so-called solder splash occurs, a path through which the solder spreads is longer by the length of the second resin body 40. As a result, a short circuit of the first outer electrode 27 and the second outer electrode 28 due to a solder splash may be prevented.

In the thickness direction T, a protruding measurement of the second resin body 40 with respect to the circuit layer 20 is preferably 50 µm or less. In the thickness direction T, a protruding measurement of the first resin body 30 with respect to the circuit layer 20 only needs to be smaller than the protruding measurement of the second resin body 40, and the difference from the protruding measurement of the second resin body 40 is preferably 10 µm or less.

An indentation elastic modulus of each of the first resin body 30 and the second resin body 40 is preferably lower than an indentation elastic modulus of the dielectric layer 23. In the case above, flexibility of the first resin body 30 and the second resin body 40 becomes higher than flexibility of the dielectric layer 23, and a load is easily received by the first resin body 30 and the second resin body 40. Thus, the load applied to the capacitor element, in particular, to the dielectric layer 23 is reduced. The indentation elastic modulus of each of the first resin body 30 and the second resin body 40 is preferably 20 GPa or less. The indentation elastic modulus of the first resin body 30 and the indentation elastic modulus of the second resin body 40 may be the same as or different from each other.

The indentation elastic modulus is measured by a nanoindentation method, for example.

The Young's modulus of each of the first resin body 30 and the second resin body 40 is preferably 20 GPa or less. In the case above, since the flexibility of each of the first resin body 30 and the second resin body 40 is sufficiently high, a load is easily received by the first resin body 30 and the second resin body 40, and thus the load applied to the capacitor element is sufficiently reduced. Further, each of the Young's modulus of the first resin body 30 and the second resin body 40 is more preferably 0.5 GPa to 20 GPa. The Young's modulus of the first resin body 30 and the Young's modulus of the second resin body 40 may be the same as or different from each other.

The Young's modulus is measured by a tensile test method, for example.

Each of the first resin body 30 and the second resin body 40 preferably contains at least one resin selected from the group consisting of a resin in a solder resist, a polyimide resin, a polyimideamide resin, and an epoxy resin. The resin included in the first resin body 30 and the resin included in the second resin body 40 may be the same as or different from each other.

Each of the first resin body 30 and the second resin body 40 is preferably a cured product of a photosensitive resin.

FIG. 2-1 is a schematic plan view of the capacitor according to Embodiment 1 of the present invention illustrating a first modification thereof. FIG. 2-2 is a schematic side view of the capacitor illustrated in FIG. 2-1. FIG. 2-3 is a schematic sectional view of a portion corresponding to a line segment A1-A2 in FIG. 2-1.

As in a capacitor 1A illustrated in FIG. 2-1, FIG. 2-2, and FIG. 2-3, the first resin body 30 may have a shape in which the top end is thinner than a bottom portion. In the case above, the first resin body 30 is easily deformed by a load at the time of mounting. As a result, the load is less likely to be instantaneously and locally applied in the first resin body 30 at a start of contact with the wiring substrate side. The top end of the first resin body 30 may have an acute angle, or may be pointed.

Similarly, the second resin body 40 may have a shape in which the top end is thinner than the bottom portion. In the case above, the second resin body 40 is easily deformed by a load at the time of mounting. As a result, the load is less likely to be instantaneously and locally applied in the second resin body 40 at a start of contact with the wiring substrate side. The top end of the second resin body 40 may have an acute angle, or may be pointed.

FIG. 3-1 is a schematic plan view of the capacitor according to Embodiment 1 of the present invention illustrating a second modification thereof. FIG. 3-2 is a schematic side view of the capacitor illustrated in FIG. 3-1. FIG. 3-3 is a schematic sectional view of a portion corresponding to a line segment A1-A2 in FIG. 3-1.

As in a capacitor 1B illustrated in FIG. 3-1, FIG. 3-2, and FIG. 3-3, the first resin body 30 may have a shape, in which the top end is thinner than the bottom portion and a side surface on a side close to the end portion of the substrate 10 rises steeply against the first main surface 10a of the substrate 10. In the case above, the stress applied to the end portion of the second electrode layer 24 is further reduced. The top end of the first resin body 30 may have an acute angle, or may be pointed.

Figures 1, 4:
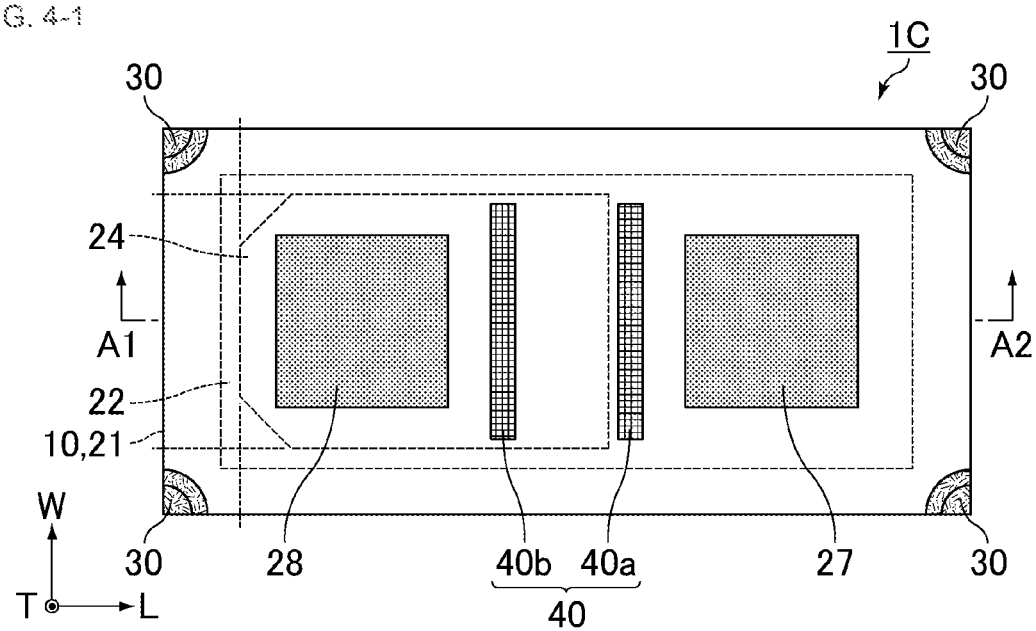
Figures 2, 4:
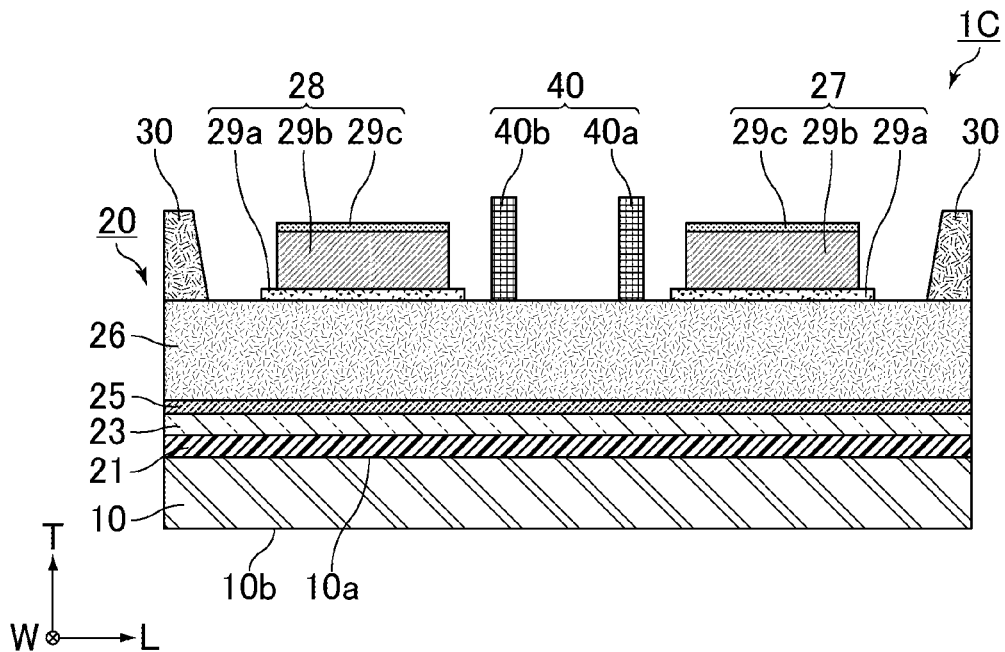
Figures 3, 4:
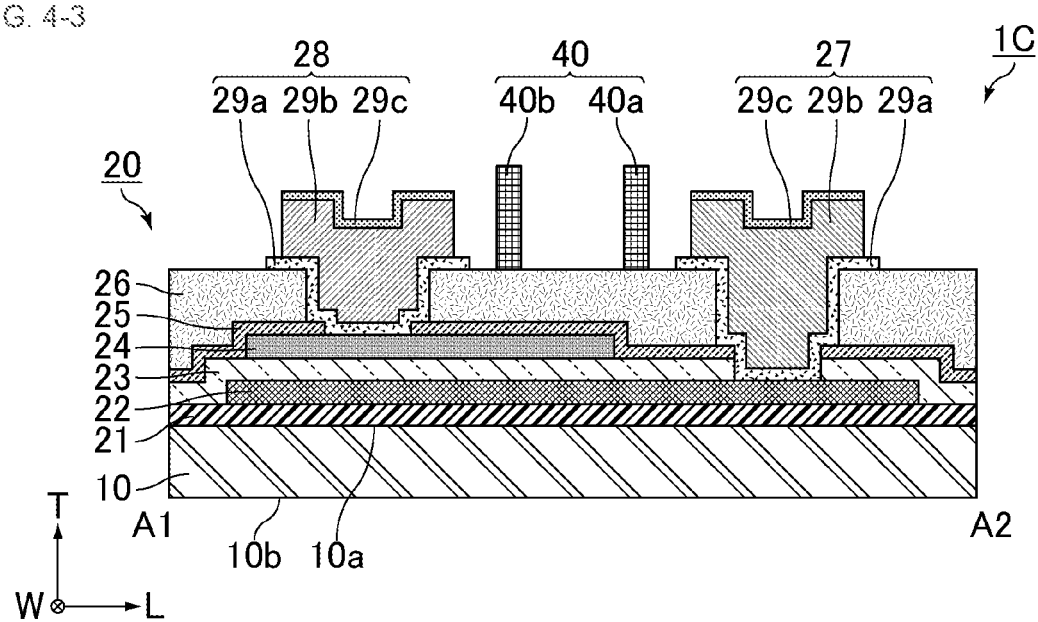

FIG. 4-1 is a schematic plan view of the capacitor according to Embodiment 1 of the present invention illustrating a third modification thereof. FIG. 4-2 is a schematic side view of the capacitor illustrated in FIG. 4-1. FIG. 4-3 is a schematic sectional view of a portion corresponding to a line segment A1-A2 in FIG. 4-1.

As in a capacitor 1C illustrated in FIG. 4-1, FIG. 4-2, and FIG. 4-3, a corner portion of the second electrode layer 24 closer to a corner portion of the capacitor element may be cut off. Thus, the stress applied to the corner portion of the second electrode layer 24 may further be reduced. Examples of the shape obtained by cutting off the corner portion of the second electrode layer 24 include an arc shape and a polygonal shape. In order to increase the distance from the corner portion of the capacitor element, the corner portion of the second electrode layer 24 is preferably greater than 90°.

The capacitor 1 in FIG. 1-1, FIG. 1-2, and FIG. 1-3, which is an example of the capacitor according to Embodiment 1 of the present invention, is manufactured by the following method, for example. FIG. 5-1, FIG. 5-2, FIG. 5-3, FIG. 5-4, FIG. 5-5, FIG. 5-6, FIG. 5-7, FIG. 5-8, FIG. 5-9, FIG. 5-10, and FIG. 5-11 each are a schematic sectional view for explaining an example of a method for manufacturing the capacitor according to Embodiment 1 of the present invention.

<Formation of Insulation Layer>

Figures 1, 5:
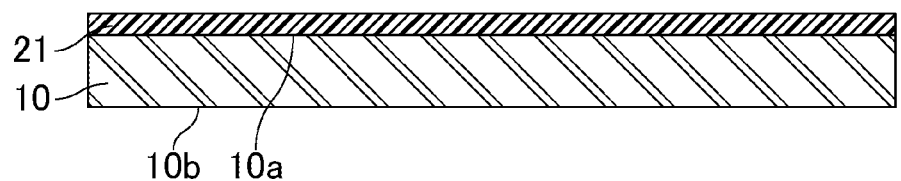
Figures 2, 5:
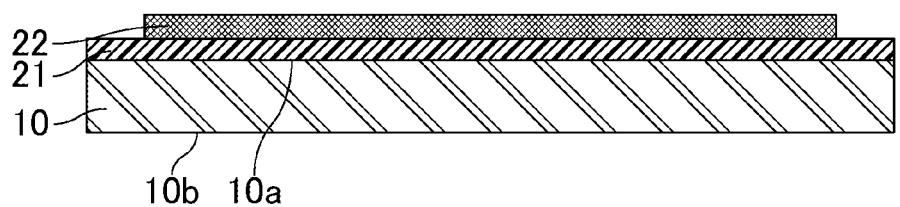
Figures 3, 5:
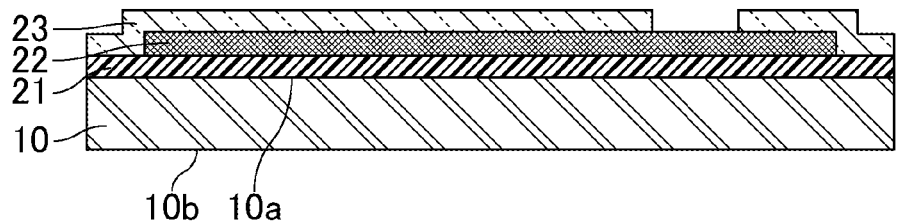
Figures 4, 5:
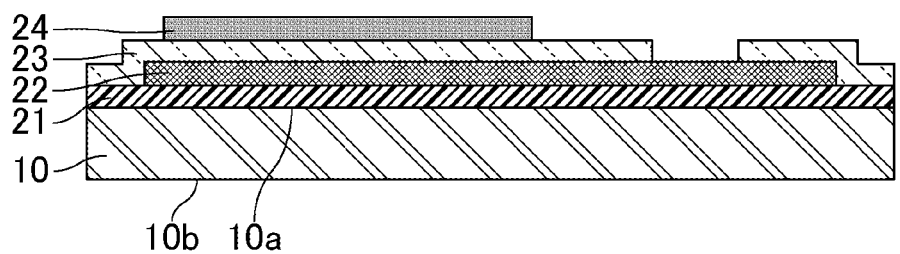
Figure 5:
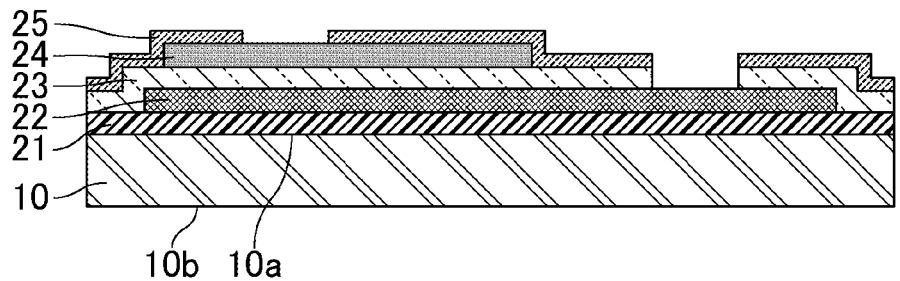

FIG. 5-1 is a schematic sectional view for explaining an example of a process of forming an insulation layer.

As illustrated in FIG. 5-1, the insulation layer 21 is formed on the first main surface 10a of the substrate 10 by a thermal oxidation method, a sputtering method, or a chemical vapor deposition method, for example.

<Formation of First Electrode Layer>

FIG. 5-2 is a schematic sectional view for explaining an example of a process of forming a first electrode layer.

A conductor layer made of the constituent material of the first electrode layer 22 is formed on the surface of the insulation layer 21 on the side opposite to the substrate 10 by a sputtering method, for example. Thereafter, the conductor layer is patterned to form the first electrode layer 22 as illustrated in FIG. 5-2 by a combination of a photolithography method and an etching method. More specifically, the first electrode layer 22 is formed inside a position separated from the end portion of the substrate 10.

<Formation of Dielectric Layer>

FIG. 5-3 is a schematic sectional view for explaining an example of a process of forming a dielectric layer.

A layer made of the constituent material of the dielectric layer 23 is formed so as to cover the first electrode layer 22 by a sputtering method or a chemical vapor deposition method, for example. Thereafter, the layer above is patterned to form the dielectric layer 23 as illustrated in FIG. 5-3 by a combination of a photolithography method and an etching method, for example. More specifically, the dielectric layer 23 is formed such that the opening for exposing part of the first electrode layer 22 is provided.

<Formation of Second Electrode Layer>

FIG. 5-4 is a schematic sectional view for explaining an example of a process of forming a second electrode layer.

A conductor layer made of the constituent material of the second electrode layer 24 is formed on a surface of a structural body illustrated in FIG. 5-3 on the side opposite to the substrate 10 by a sputtering method, for example. Thereafter, the conductor layer is patterned to form the second electrode layer 24 as illustrated in FIG. 5-4 by a combination of a photolithography method and an etching method, for example. More specifically, the second electrode layer 24 is formed so as to face the first electrode layer 22 with the dielectric layer 23 interposed therebetween.

<Formation of Moisture-Resistant Protection Layer>

FIG. 5-5 is a schematic sectional view for explaining an example of a process of forming a moisture-resistant protection layer.

A layer made of the constituent material of the moisture-resistant protection layer 25 is formed on a surface of a structural body illustrated in FIG. 5-4 on the side opposite to the substrate 10 by a chemical vapor deposition method, for example. Thereafter, the layer above is patterned to form the moisture-resistant protection layer 25 as illustrated in FIG. 5-5 by a combination of a photolithography method and an etching method, for example. More specifically, the moisture-resistant protection layer 25 is formed such that openings are provided at each of a position overlapping with the opening of the dielectric layer 23 for exposing the part of the first electrode layer 22 and a position for exposing part of the second electrode layer 24.

<Formation of Resin Protection Layer>

Figures 5, 6:
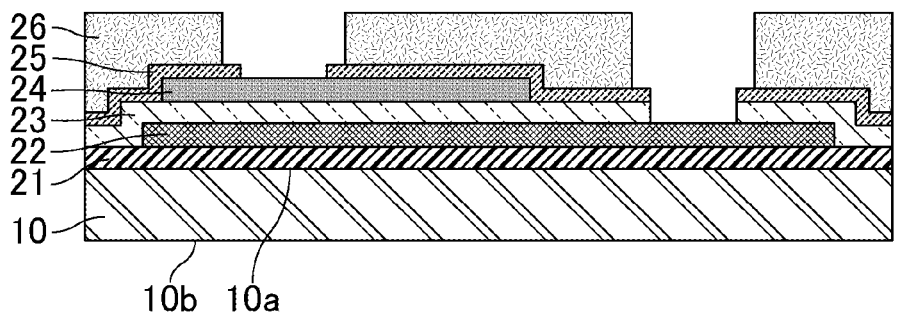

FIG. 5-6 is a schematic sectional view for explaining an example of a process of forming a resin protection layer.

A layer made of the constituent material of the resin protection layer 26 is formed on a surface of a structural body illustrated in FIG. 5-5 on the side opposite to the substrate 10 by a spin coating method, for example. Thereafter, the resin protection layer 26 as illustrated in FIG. 5-6 is formed by patterning the layer above as follows, for example. When the constituent material of the resin protection layer 26 is photosensitive, only a photolithography method is used, and when the constituent material of the resin protection layer 26 is non-photosensitive, combination of a photolithography method and an etching method is employed. More specifically, the resin protection layer 26 is formed such that openings are provided at each of a position overlapping with the openings of the dielectric layer 23 and the moisture-resistant protection layer 25 for exposing the part of the first electrode layer 22 and a position overlapping with the opening of the moisture-resistant protection layer 25 for exposing the part of the second electrode layer 24.

<Formation of Outer Electrode>

Figures 5, 6, 7:
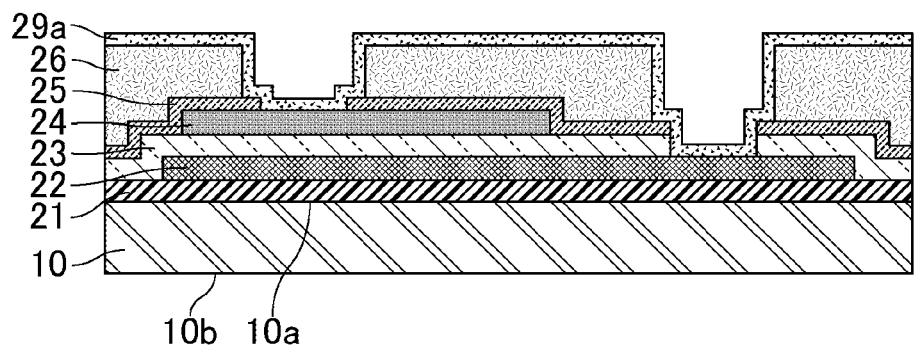

FIG. 5-7 is a schematic sectional view for explaining an example of a process of forming a seed layer. FIG. 5-8 is a schematic sectional view for explaining an example of a process of forming a first plating layer and a second plating layer. FIG. 5-9 is a schematic sectional view for explaining an example of a process of removing part of the seed layer.

As illustrated in FIG. 5-7, the seed layer 29a is formed on a surface of a structural body illustrated in FIG. 5-6 on the side opposite to the substrate 10. The first plating layer 29b and the second plating layer 29c as illustrated in FIG. 5-8 are sequentially formed by combining a plating process and a photolithography method. Thereafter, as illustrated in FIG. 5-9, part of the seed layer 29a is removed by an etching method, for example. Thus, the first outer electrode 27 and the second outer electrode 28 as illustrated in FIG. 5-9 are formed. More specifically, the first outer electrode 27 is formed so as to be electrically connected to the first electrode layer 22 through the openings provided in each of the dielectric layer 23, the moisture-resistant protection layer 25, and the resin protection layer 26. Further, the second outer electrode 28 is formed so as to be electrically connected to the second electrode layer 24 through the openings provided in each of the moisture-resistant protection layer 25 and the resin protection layer 26.

Thus, the circuit layer 20 as illustrated in FIG. 5-9 is formed on the first main surface 10a of the substrate 10. The first outer electrode 27 extends to the surface of the circuit layer 20 on the side opposite to the substrate 10, and is separated from the second outer electrode 28. Further, the second outer electrode 28 extends to the surface of the circuit layer 20 on the side opposite to the substrate 10 and is separated from the first outer electrode 27.

<Formation of First Resin Body and Second Resin Body>

FIG. 5-10 is a schematic sectional view for explaining an example of a process of forming a photosensitive resin film. FIG. 5-11 is a schematic sectional view for explaining an example of a process of forming a first resin body and a second resin body.

As illustrated in FIG. 5-10, a photosensitive resin film 35 is formed on the surface of the circuit layer 20 on the side opposite to the substrate 10. The first resin body 30 (see FIG. 1-2) is, then, formed on the surface of the circuit layer 20 on the side opposite to the substrate 10 by patterning the photosensitive resin film 35 using a photolithography method.

Similarly, a photosensitive resin film 35 is formed on the surface of the circuit layer 20 on the side opposite to the substrate 10. The second resin body 40 as illustrated in FIG. 5-11 is, then, formed on the surface of the circuit layer 20 on the side opposite to the substrate 10 by patterning the photosensitive resin film 35 using a photolithography method.

The second resin body 40 may be formed at the same time with the first resin body 30 using the same material. By forming the first resin body 30 and the second resin body 40 at the same time, it becomes easy to precisely control the difference between the height of the first resin body 30 and the height of the second resin body 40 in a plane. Further, the process may be shortened and the manufacturing cost may be reduced.

The capacitor 1 is manufactured as described above.

Hereinbefore, a case in which one capacitor 1 is manufactured has been described, but a plurality of capacitors 1 may be manufactured at the same time by forming a plurality of circuit layers 20 on the first main surface 10a of the same substrate 10, and then cutting the substrate 10 into individual pieces with a dicing machine or the like.

The module according to the present invention includes the semiconductor device according to the present invention, and a wiring substrate having a first land electrically connected to the first outer electrode and a second land electrically connected to the second outer electrode. Hereinafter, a module including the capacitor according to Embodiment 1 of the present invention will be described as a module according to Embodiment 1 of the present invention.

FIG. 6 is a schematic sectional view of the module according to Embodiment 1 of the present invention.

As illustrated in FIG. 6, a module 100 includes the capacitor 1 and a wiring substrate 50. More specifically, in the module 100, the capacitor 1 is mounted on the wiring substrate 50.

The wiring substrate 50 includes a substrate 51, a first land 52, and a second land 53.

Various wiring lines are provided on the substrate 51. The various wiring lines of the substrate 51 are independently connected to the first land 52 and the second land 53.

The first land 52 is provided on a surface of the substrate 51 and is electrically connected to the first outer electrode 27. More specifically, the first land 52 is electrically connected to the first outer electrode 27 via a solder 60.

Examples of the constituent material of the first land 52 include a metal such as copper (Cu).

The second land 53 is provided at a position separated from the first land 52 on the surface of the substrate 51, and is electrically connected to the second outer electrode 28. More specifically, the second land 53 is electrically connected to the second outer electrode 28 via the solder 60.

Examples of the constituent material of the second land 53 include a metal such as copper (Cu).

In the module 100, the second resin body 40 is not in contact with the wiring substrate 50 side (first land 52, second land 53, solder 60, and the like, for example). This is considered to be due to the following mechanism, for example.

As a first mechanism, there will be described a case that the capacitor 1 is mounted on the wiring substrate 50 in a state of being not displaced. When the capacitor 1 is mounted on the wiring substrate 50 via the solder 60, firstly, the second resin body 40 comes into contact with the solder 60. Thereafter, when a reflow process is performed, although the solder 60 spreads out over each of the entire first land 52 and the entire second land 53, the solder 60 avoids the second resin body 40, and as a result, the second resin body 40 does not come into contact with the solder 60.

As a second mechanism, there will be described a case that the capacitor 1 is mounted on the wiring substrate 50 in a state of being displaced. In the case above, as a result, the second resin body 40 does not come into contact with the solder 60 due to a self-alignment effect during a reflow process.

In the module 100, as illustrated in FIG. 7, a mold resin 70 may be provided between the wiring substrate 50 and each of the first outer electrode 27 and the second outer electrode 28. FIG. 7 is a schematic sectional view illustrating a state that a mold resin is provided to the module according to Embodiment 1 of the present invention.

Further, in a case that the first resin body 30 is provided only at each of the four corners of the substrate 10 as in the capacitor 1, there is a path opening and filled with a mold resin at the time of molding with a resin after mounting, and thus a filling failure may be prevented.

Embodiment 2

The capacitor according to Embodiment 1 of the present invention may further include a third resin body. In the case above, the third resin body is provided between the first resin bodies in plan view in the thickness direction, and in the thickness direction, a top end of the third resin body on the side opposite to the substrate is positioned higher than the top ends of the first outer electrode and the second outer electrode on the side opposite to the substrate and is positioned lower than the top end of the first resin body on the side opposite to the substrate. Such an example will be described below as a capacitor according to Embodiment 2 of the present invention.

Figures 5, 6, 7, 8:
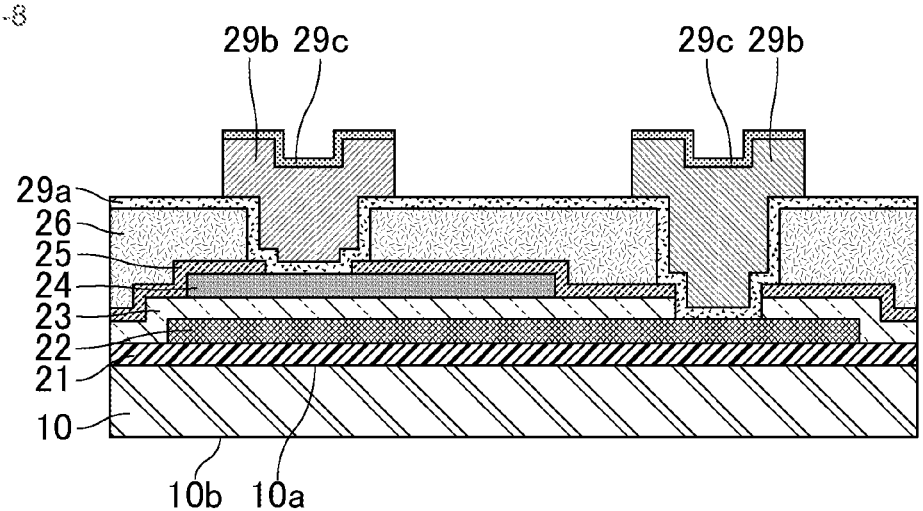

FIG. 8-1 is a schematic plan view of the capacitor according to Embodiment 2 of the present invention illustrating an example thereof. FIG. 8-2 is a schematic sectional view of a portion corresponding to a line segment A1-A2 in FIG. 8-1. FIG. 8-3 is a schematic side view of the capacitor illustrated in FIG. 8-1.

Figures 5, 6, 7, 8, 9:
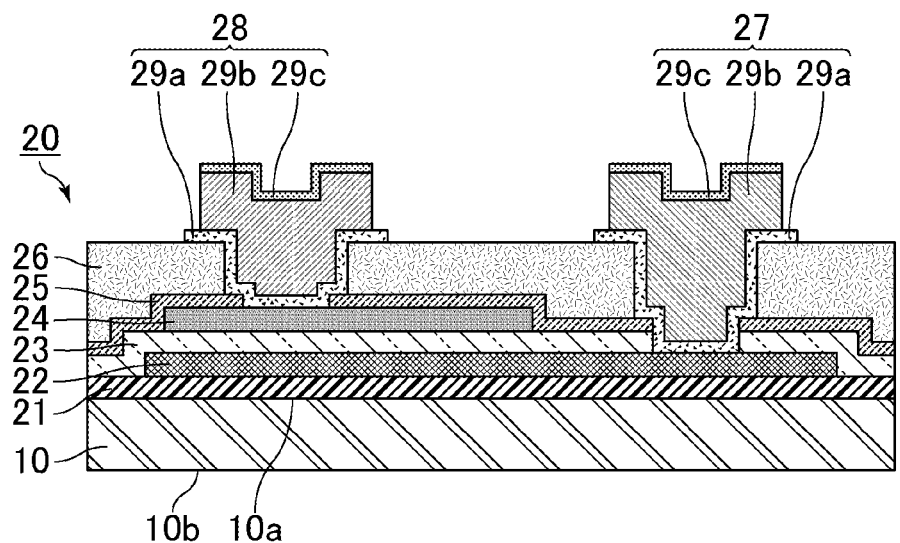

FIG. 9-1 is a schematic plan view of the capacitor according to Embodiment 2 of the present invention illustrating a modification thereof. FIG. 9-2 is a schematic sectional view of a portion corresponding to a line segment A1-A2 in FIG. 9-1. FIG. 9-3 is a schematic side view of the capacitor illustrated in FIG. 9-1.

In a capacitor 2 illustrated in FIG. 8-1, FIG. 8-2, and FIG. 8-3, and in a capacitor 2A illustrated in FIG. 9-1, FIG. 9-2, and FIG. 9-3, a third resin body 41 is provided between adjacent first resin bodies 30 in plan view in the thickness direction T. Here, the third resin body 41 is provided to an outer peripheral portion of the substrate 10 in plan view in the thickness direction T.

In the thickness direction T, a top end of the third resin body 41 on the side opposite to the substrate 10 is positioned higher than the top ends of the first outer electrode 27 and the second outer electrode 28 on the side opposite to the substrate 10, and is positioned lower than the top end of the first resin body 30 on the side opposite to the substrate 10.

In a case that the third resin body 41 is provided, for an unexpected and sudden high load at the time of mounting, the load that cannot be dispersed by the first resin body 30 can further be dispersed by the third resin body 41. Thus, breakage of the dielectric layer 23 may be prevented.

The first resin body 30 and the third resin body 41 may be connected to each other, but it is preferable that the first resin body 30 and the third resin body 41 be separated from each other at bottom portions because, in that case, a load at the time of mounting is not transferred from the first resin body 30 to the third resin body 41. The constituent material of the third resin body 41 may be the same as the constituent material of the first resin body 30. The third resin body 41 may be formed at the same time as the first resin body 30.

Embodiment 3

In the capacitor according to Embodiment 1 or Embodiment 2 of the present invention, the circuit layer may further include a third electrode layer provided to face the first electrode layer and to be separated from the second electrode layer. Such an example will be described below as a capacitor according to Embodiment 3 of the present invention.

Figures 5, 6, 7, 8, 9, 10:
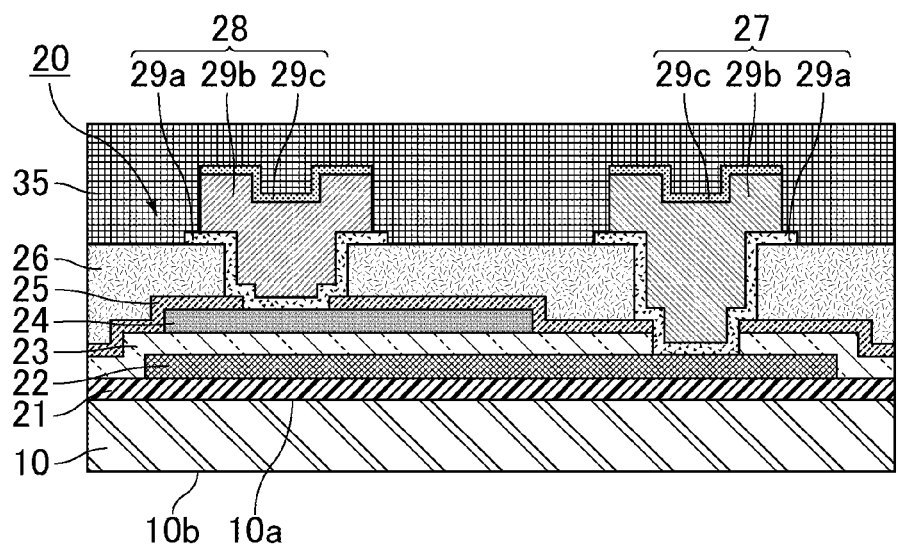

FIG. 10-1 is a schematic plan view of the capacitor according to Embodiment 3 of the present invention illustrating an example thereof. FIG. 10-2 is a schematic side view of the capacitor illustrated in FIG. 10-1. FIG. 10-3 is a schematic sectional view of a portion corresponding to a line segment A1-A2 in FIG. 10-1.

Figures 5, 6, 7, 8, 9, 10, 11:
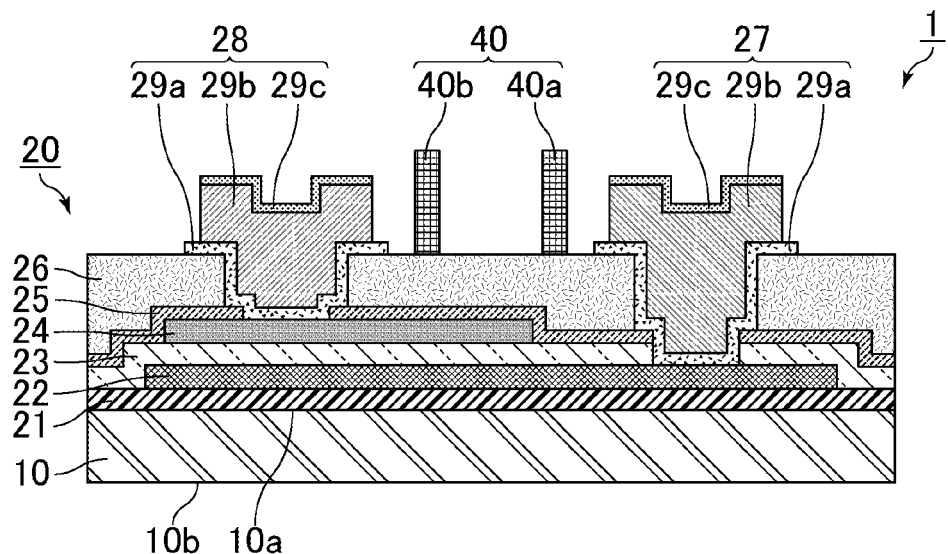
Figure 6:
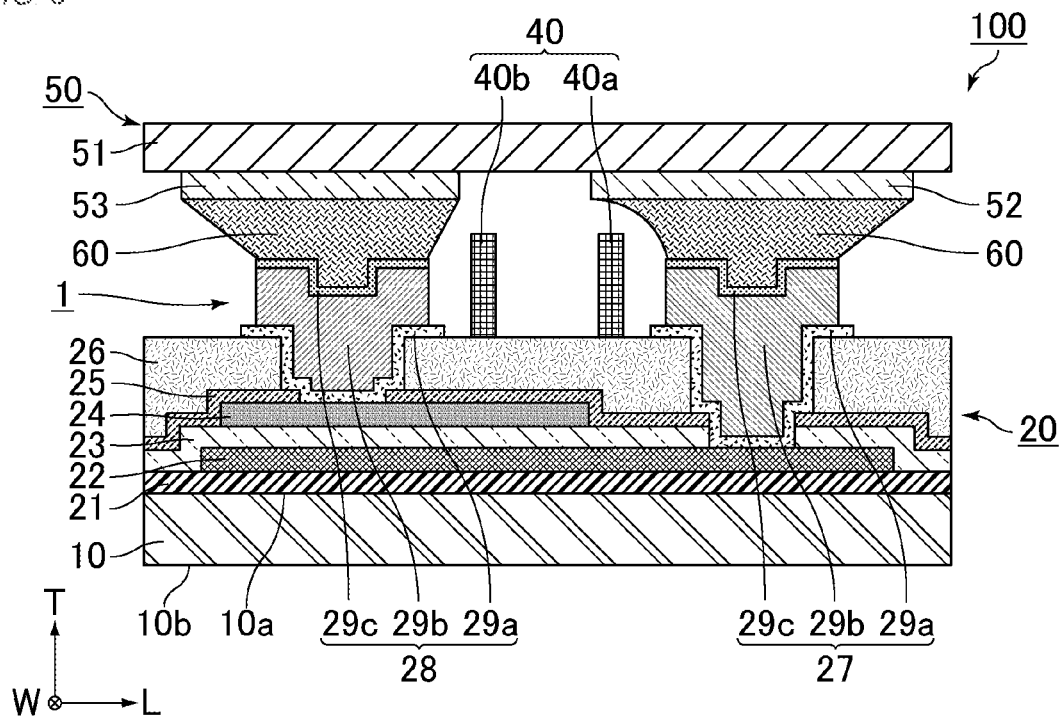
Figure 7:
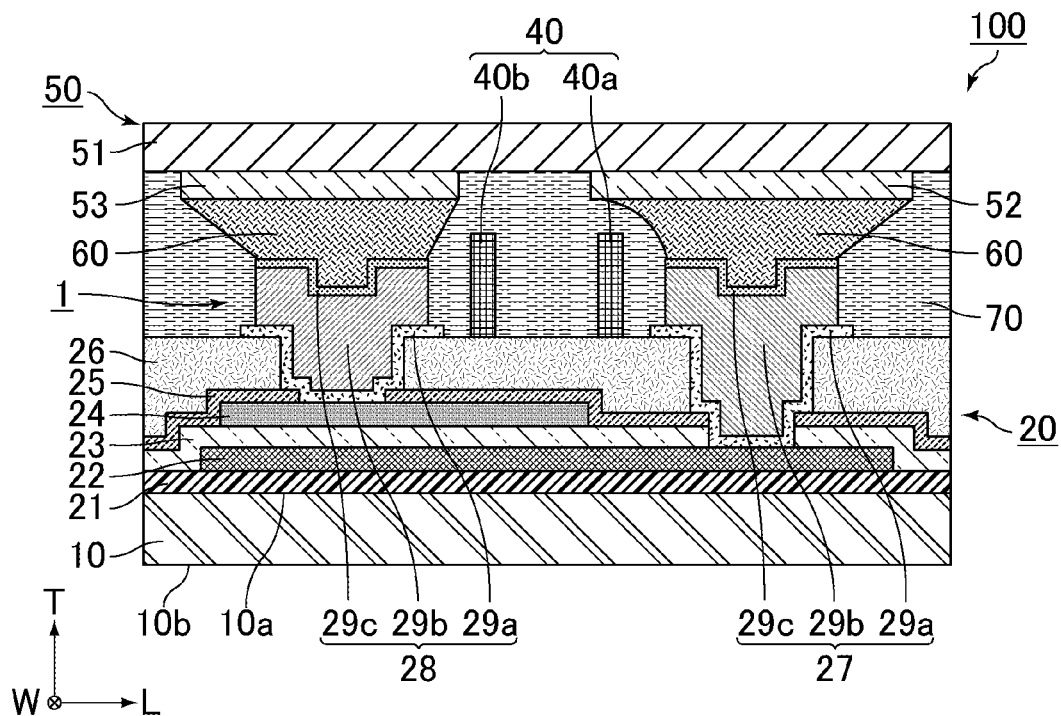
Figures 1, 8:
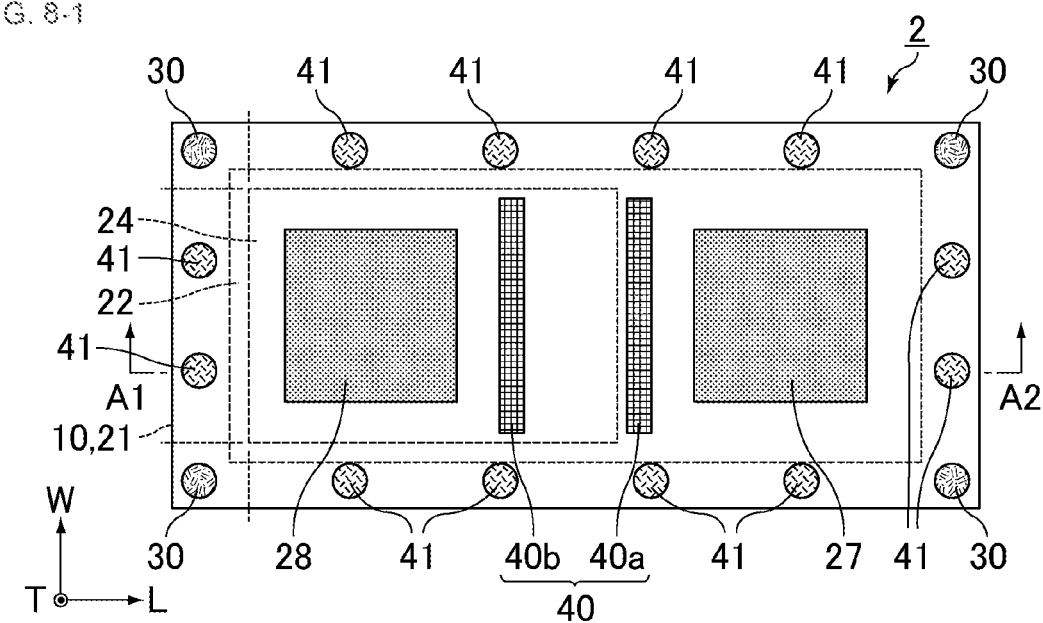
Figures 2, 8:
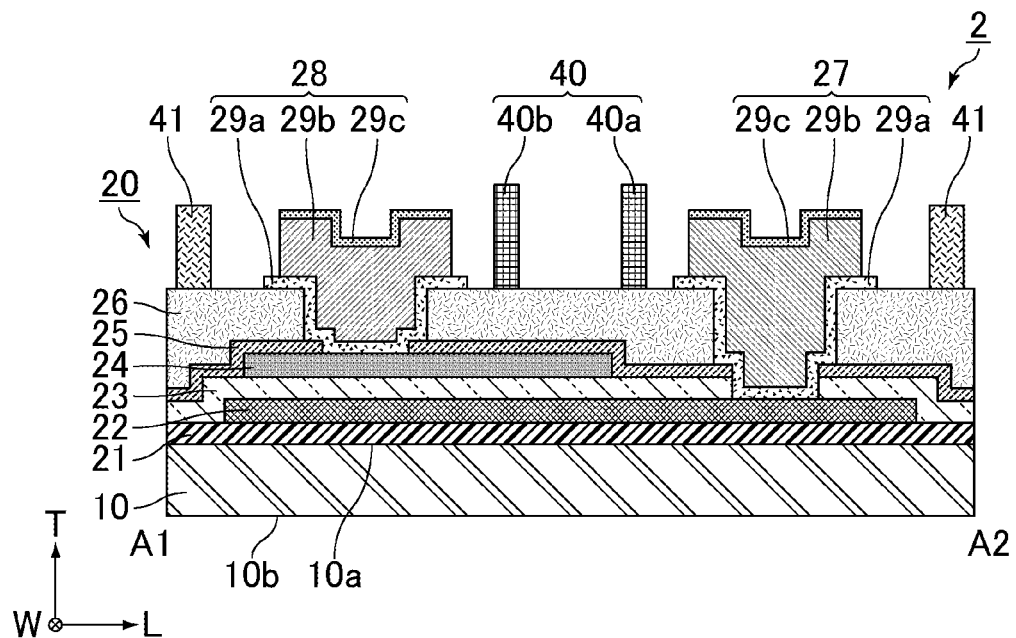
Figures 3, 8:
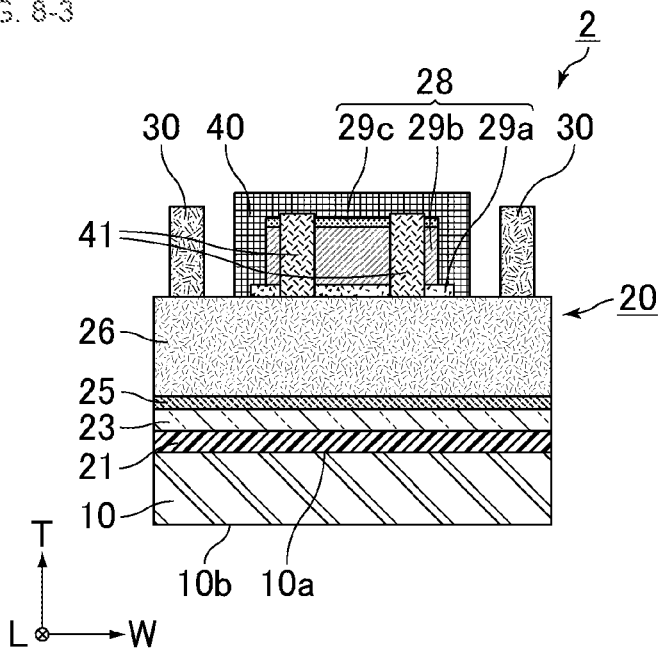
Figures 1, 9:
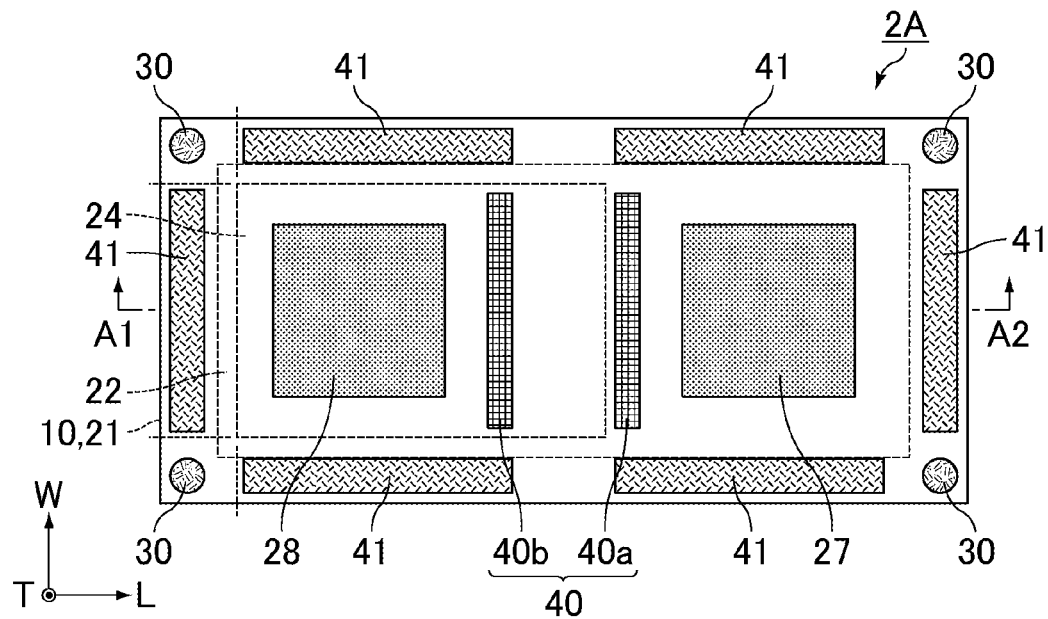
Figures 2, 9:
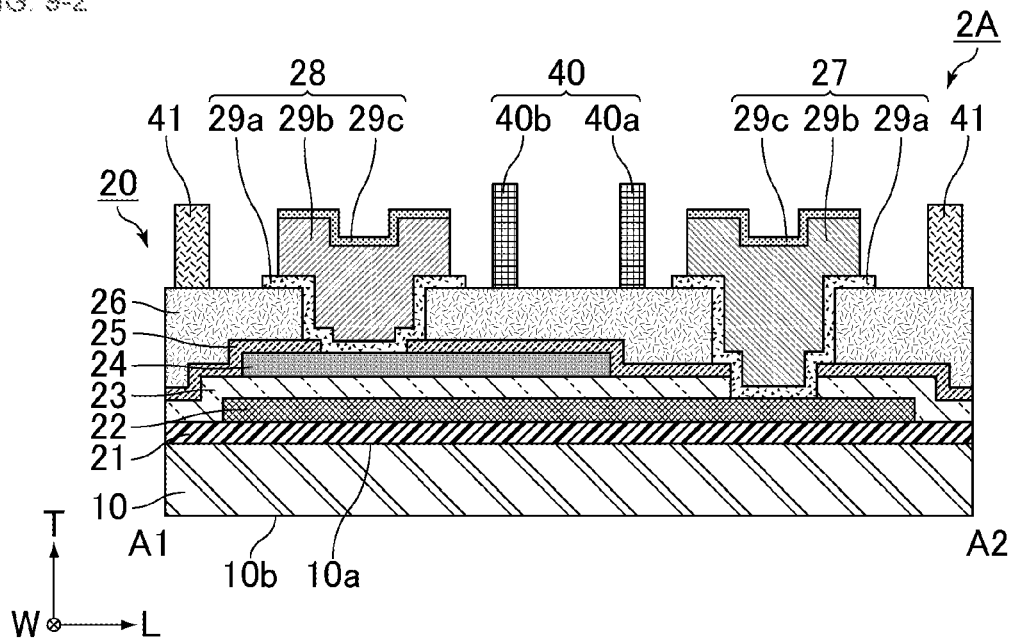
Figures 3, 9:
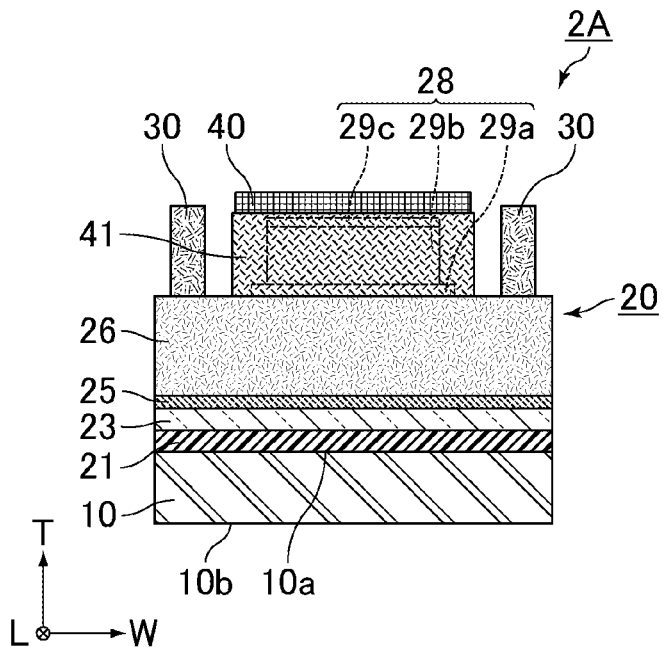
Figures 1, 10:
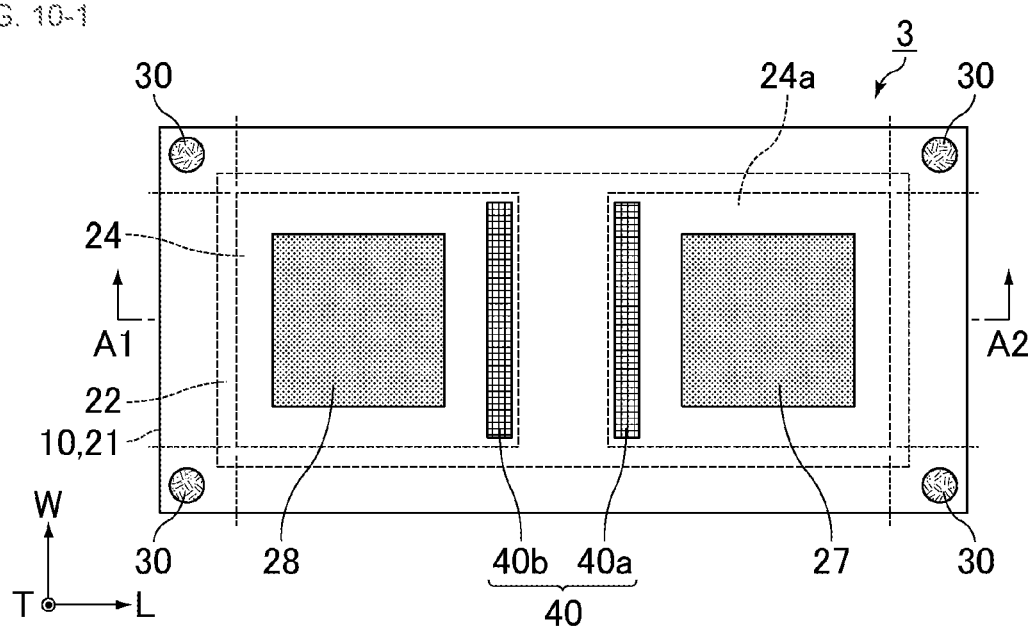
Figures 2, 10:
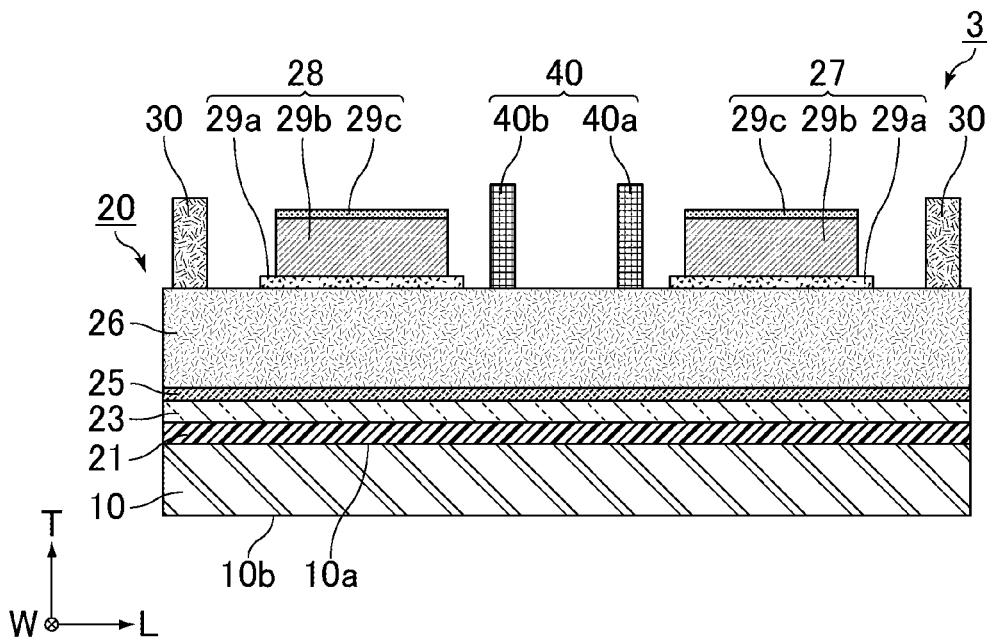
Figures 3, 10:
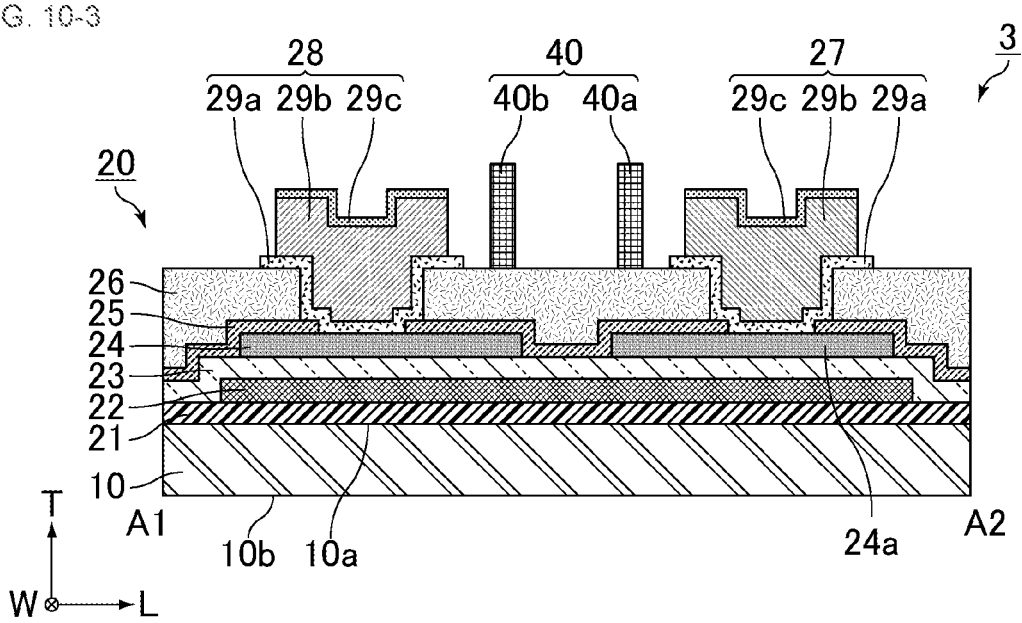
Figures 1, 11:
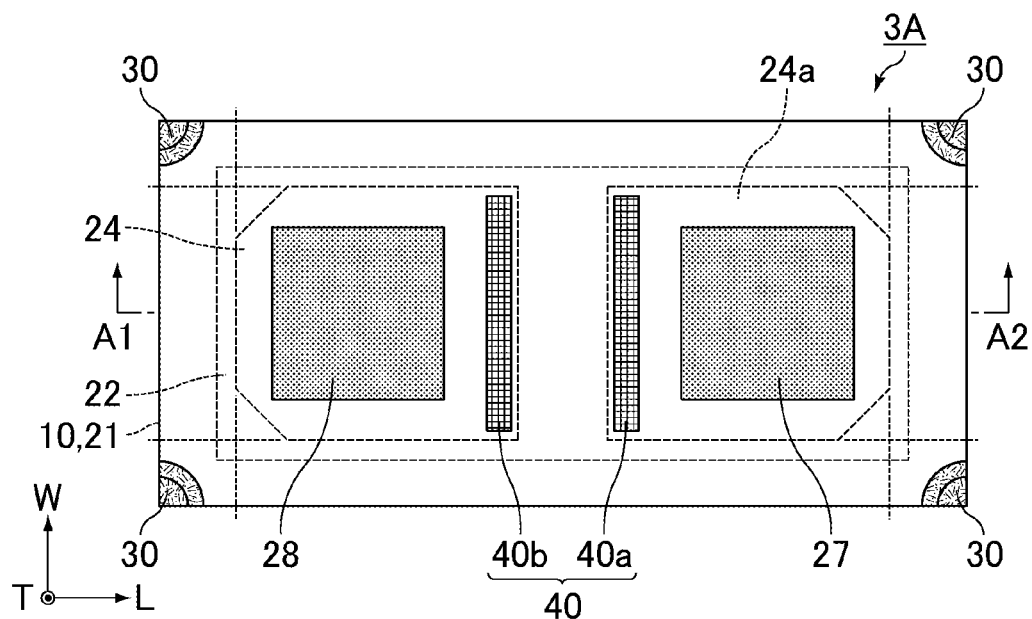
Figures 2, 11:
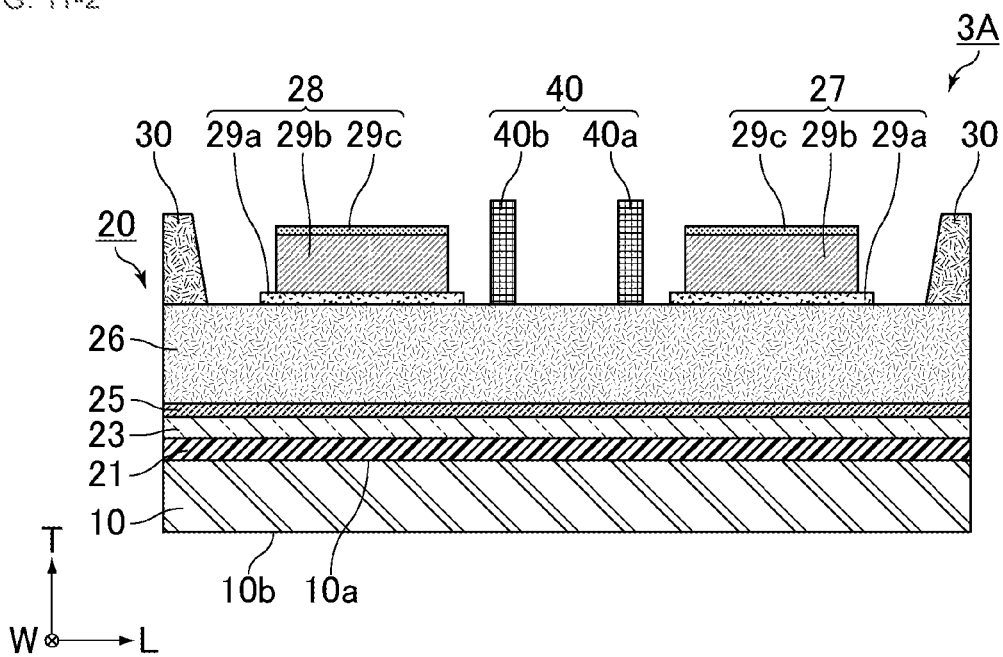
Figures 3, 11:
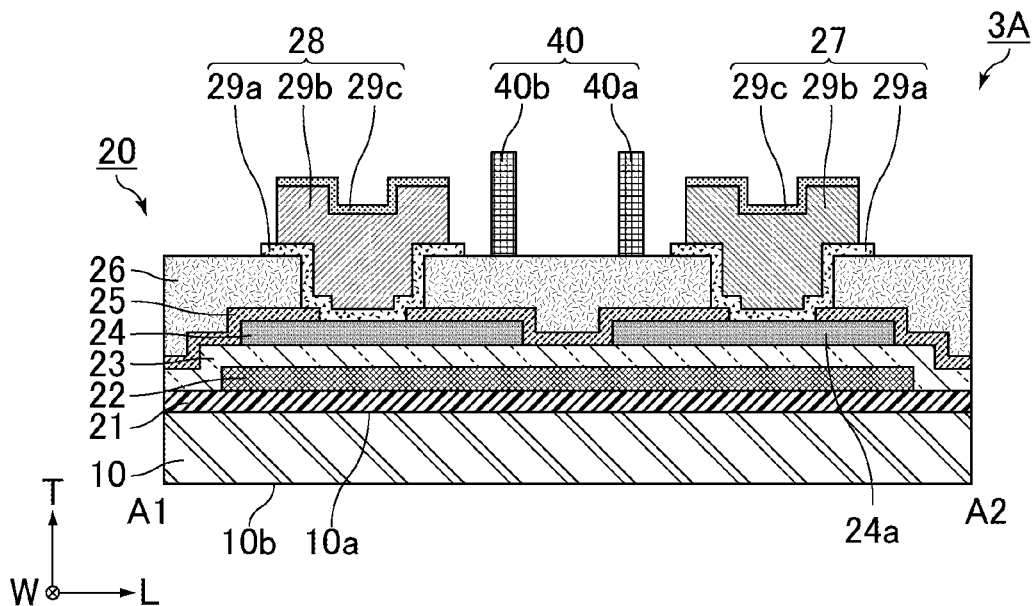

FIG. 11-1 is a schematic plan view of the capacitor according to Embodiment 3 of the present invention illustrating a modification thereof. FIG. 11-2 is a schematic side view of the capacitor illustrated in FIG. 11-1. FIG. 11-3 is a schematic sectional view of a portion corresponding to a line segment A1-A2 in FIG. 11-1.

In a capacitor 3 illustrated in FIG. 10-1, FIG. 10-2, and FIG. 10-3, and in a capacitor 3A illustrated in FIG. 11-1, FIG. 11-2, and FIG. 11-3, the circuit layer 20 further includes a third electrode layer 24a.

The first outer electrode 27 extends to the surface of the circuit layer 20 on the side opposite to the substrate 10, and is separated from the second outer electrode 28. That is, the first outer electrode 27 is positioned on the third electrode layer 24a on the side opposite to the substrate 10. Here, the first outer electrode 27 is electrically connected to the third electrode layer 24a. More specifically, the openings provided in the respective moisture-resistant protection layer 25 and resin protection layer 26 are communicated with each other along the thickness direction T to extend, and the first outer electrode 27 is electrically connected to the third electrode layer 24a through the openings. The first outer electrode 27 is separated from the first electrode layer 22 in a plane along the length direction L and the thickness direction T (see FIG. 10-3 and FIG. 11-3), and thus the first outer electrode 27 is not electrically connected to the first electrode layer 22.

The third electrode layer 24a faces the first electrode layer 22, and is separated from the second electrode layer 24. More specifically, the third electrode layer 24a is provided on the surface of the dielectric layer 23 on the side opposite to the substrate 10, and faces the first electrode layer 22 with the dielectric layer 23 interposed therebetween.

Examples of the constituent material of the third electrode layer 24a include metals such as aluminum (Al), silicon (Si), copper (Cu), silver (Ag), gold (Au), nickel (Ni), chromium (Cr), and titanium (Ti). The constituent material of the third electrode layer 24a may be an alloy containing at least one of the above-described metals, and specific examples thereof include an aluminum-silicon alloy (AlSi), an aluminum-copper alloy (AlCu), and an aluminum-silicon-copper alloy (AlSiCu).

The third electrode layer 24a may have a single-layer structure or a multilayer structure including a plurality of conductor layers made of the above-described material.

A measurement (thickness) of the third electrode layer 24a in the thickness direction T is preferably 0.3 μm to 10 μm, and more preferably 0.5 μm to 5 μm.

The first electrode layer 22, the dielectric layer 23, and third electrode layer 24a constitute a capacitor element. More specifically, capacitance of the capacitor element is formed in a region where the first electrode layer 22, the dielectric layer 23, and the third electrode layer 24a overlap with each other.

The capacitor 1 illustrated in FIG. 1-1, FIG. 1-2, and FIG. 1-3 is configured to have a capacitor formed on the left side, whereas each of the capacitor 3 illustrated in FIG. 10-1, FIG. 10-2, and FIG. 10-3, and the capacitor 3A illustrated in FIG. 11-1, FIG. 11-2, and FIG. 11-3 is configured to have capacitors formed on right and left sides. As a result, a capacitor having the same capacitance as that of the capacitor 1 may be formed with approximately one half of a thickness of the dielectric layer 23. The dielectric layer 23 of a capacitor having small capacitance may, therefore, be made thin, and the manufacturing cost may be reduced accordingly. Meanwhile, when the dielectric layer 23 is thin, breakage of the capacitor element tends to occur when a load is applied. However, disposing the first resin body 30 on each of the four corners enables breakage of the capacitor element to be prevented.

Embodiment 4

A semiconductor device of the present invention does not necessarily include the second resin body. In the case above, the thickness of the dielectric layer is preferably 0.5 μm or less, more preferably 0.3 μm or less. Such an example will be described below as a capacitor according to Embodiment 4 of the present invention.

Figures 1, 12:
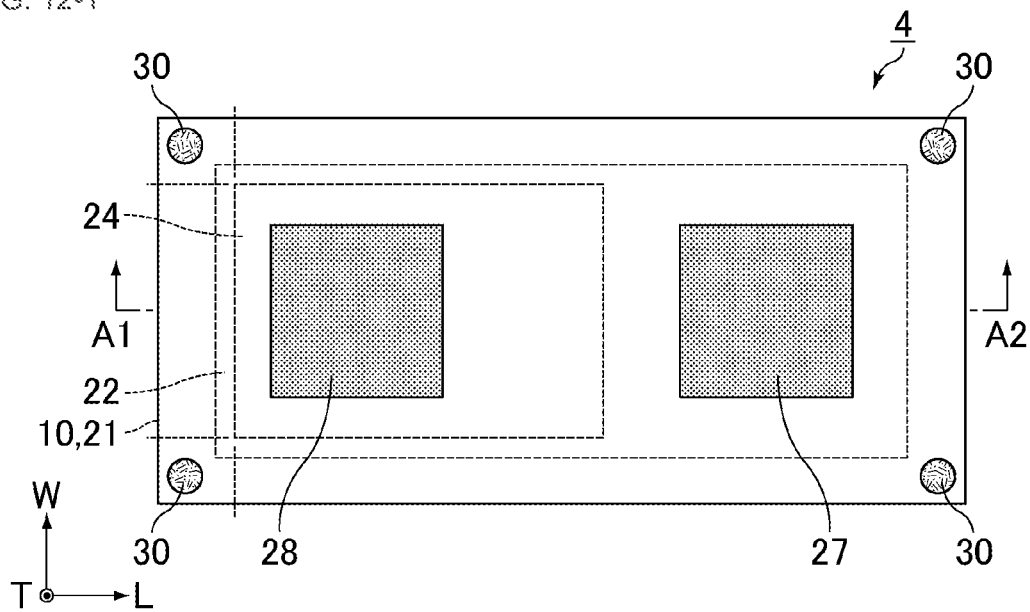
Figures 2, 12:
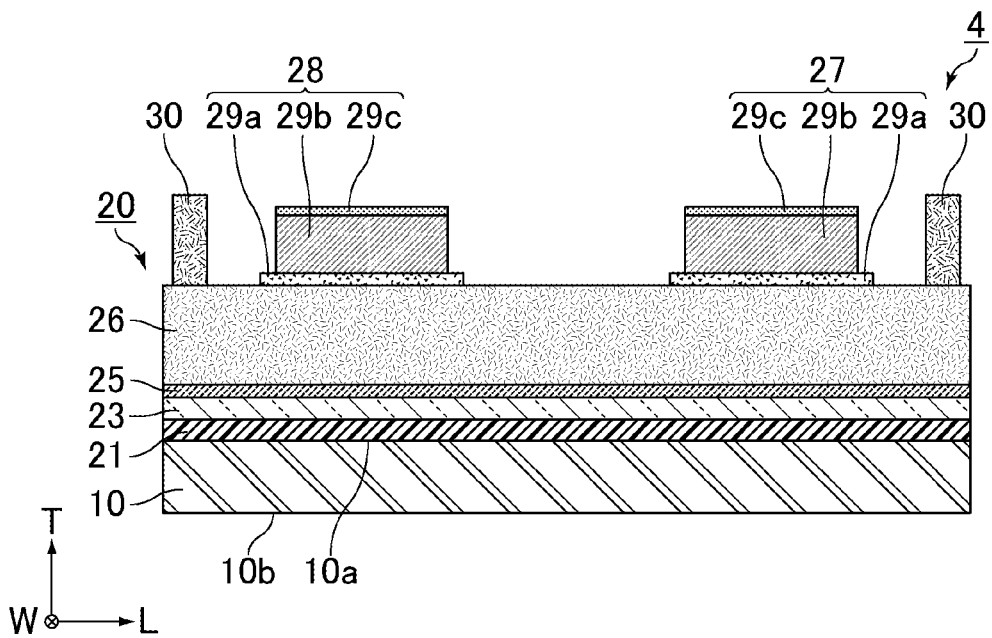
Figures 3, 12:
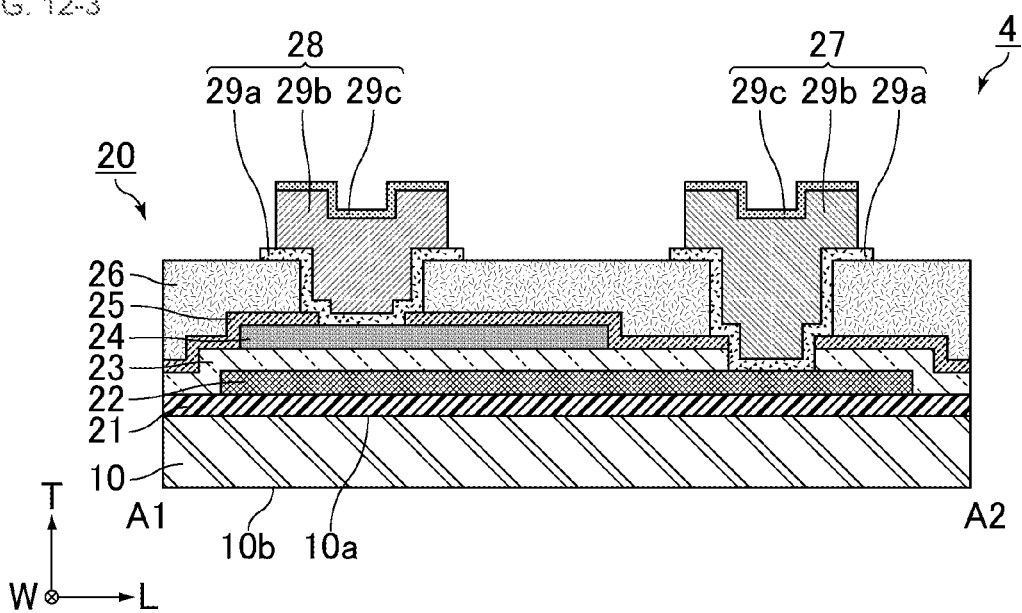

FIG. 12-1 is a schematic plan view of the capacitor according to Embodiment 4 of the present invention illustrating an example thereof. FIG. 12-2 is a schematic side view of the capacitor illustrated in FIG. 12-1. FIG. 12-3 is a schematic sectional view of a portion corresponding to a line segment A1-A2 in FIG. 12-1.

A capacitor 4 illustrated in FIG. 12-1, FIG. 12-2, and FIG. 12-3 includes the first resin body 30, but does not include the second resin body 40.

For example, in a case that the thickness of the dielectric layer 23 is as thin as 0.5 μm or less, or even 0.3 μm or less, when a load is applied to the second resin body 40 at the time of mounting, unless the height of the first resin body 30 is precisely controlled, an excessive load is applied to the dielectric layer 23 immediately below the second resin body 40 via the second resin body 40, and the dielectric layer 23 may be broken. In the case above, as illustrated in FIG. 12-1, FIG. 12-2, and FIG. 12-3, by adopting a structure in which the second resin body 40 is not provided, the load received at the time of mounting is applied to the first resin body 30. By providing the first resin body 30 only at each of the four corners of the substrate 10, the load is concentrated on each of the four corners of the substrate 10 immediately below the first resin body 30 and the stress applied to the end portion of the second electrode layer 24 is reduced, in comparison with a case that the first resin bodies 30 are provided along the outer peripheral portion of the substrate 10 and the load is concentrated on the end portion of the second electrode layer 24 via the substrate 10. Thus, a crack in the dielectric layer 23 may be prevented.

Further, at the time of molding with a resin after mounting, by providing the first resin body 30 at each of the four corners of the substrate 10 while not providing the second resin body 40 as illustrated in FIG. 12-1, FIG. 12-2, and FIG. 12-3, there is a path further opening and filled with a mold resin, in comparison with a case that the second resin body 40 is provided and the first resin bodies 30 are provided to cover the entire outer peripheral portion of the substrate 10. Thus, a filling failure may be prevented.

Embodiment 5

In the semiconductor device of the present invention, the first resin body may be provided at a position not overlapping with the resin protection layer in plan view in the thickness direction. Such an example will be described below as a capacitor according to Embodiment 5 of the present invention.

Figures 1, 13:
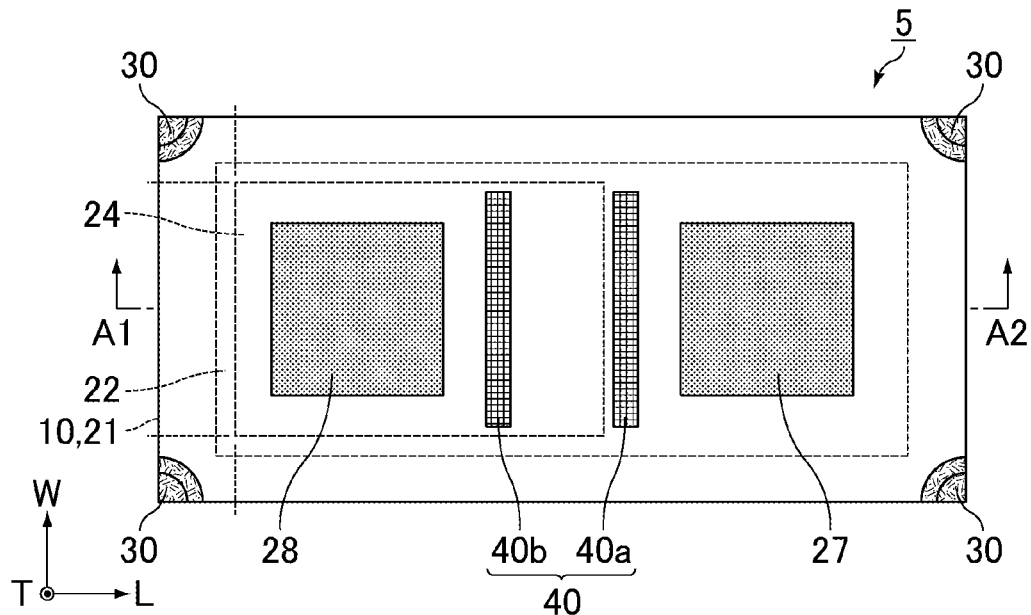
Figures 2, 13:
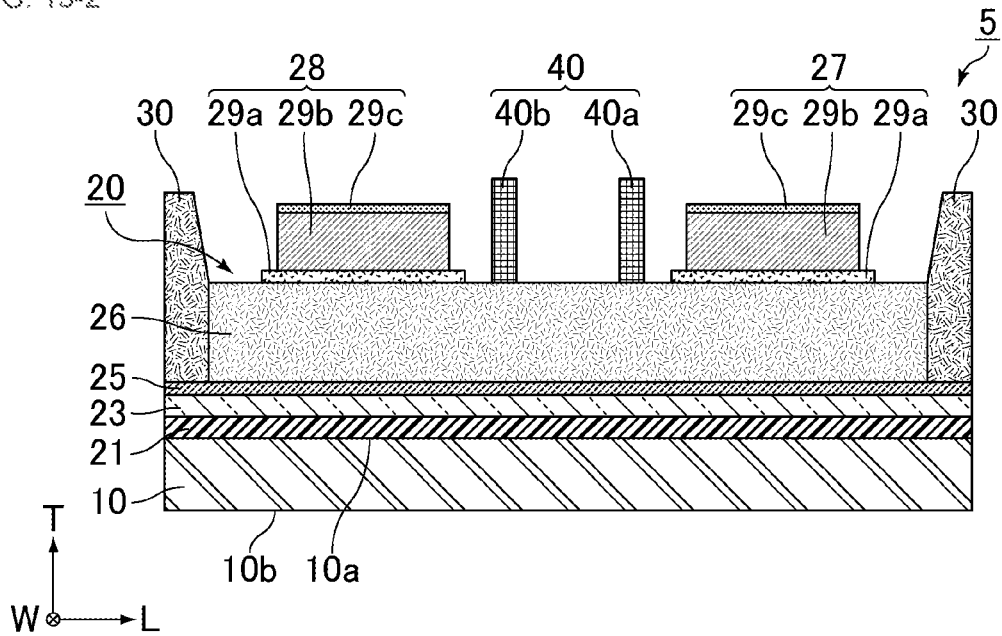
Figures 3, 13:
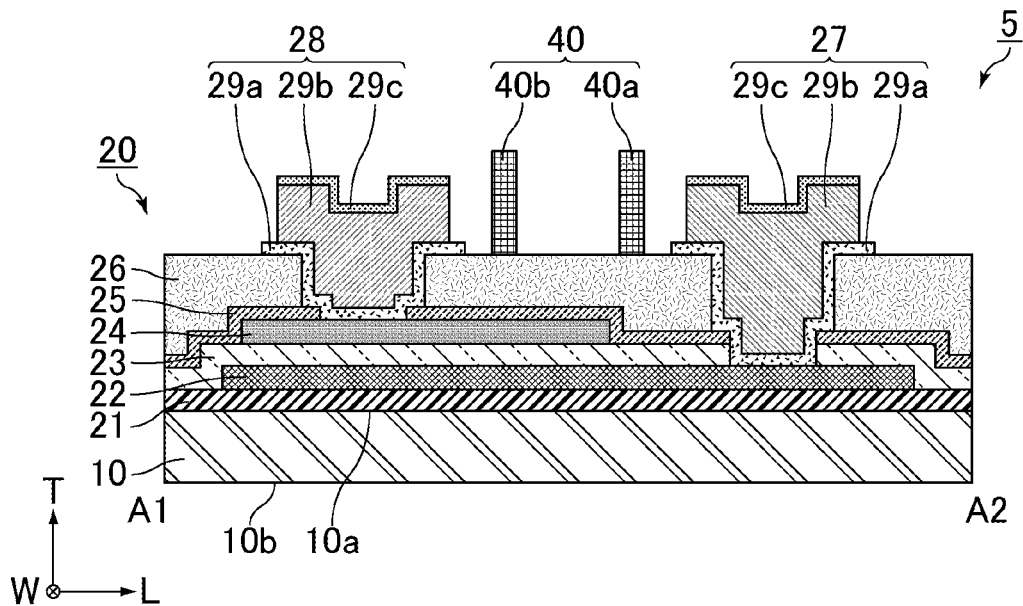

FIG. 13-1 is a schematic plan view of the capacitor according to Embodiment 5 of the present invention illustrating an example thereof. FIG. 13-2 is a schematic side view of the capacitor illustrated in FIG. 13-1. FIG. 13-3 is a schematic sectional view of a portion corresponding to a line segment A1-A2 in FIG. 13-1.

In a capacitor 5 illustrated in FIG. 13-1, FIG. 13-2, and FIG. 13-3, the first resin body 30 is provided at a position not overlapping with the resin protection layer 26 in plan view in the thickness direction T.

As illustrated in FIG. 13-1, it is preferable that the circuit layer 20 be not formed in at least four corners of the capacitor element (at least four corners of the substrate 10).

The circuit layer 20 is not necessarily formed in an outer peripheral portion of the capacitor element (outer peripheral portion of the substrate 10).

It is preferable that the first resin body 30 be directly provided on the substrate 10, but some layers may be present between the first resin body 30 and the substrate 10.

Figures 1, 14:
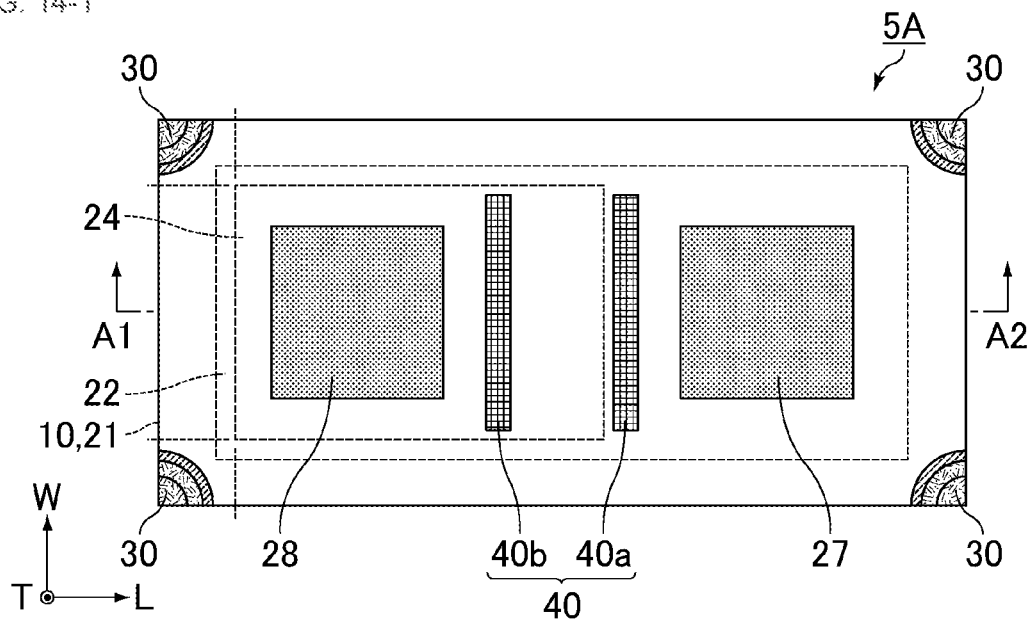
Figures 2, 14:
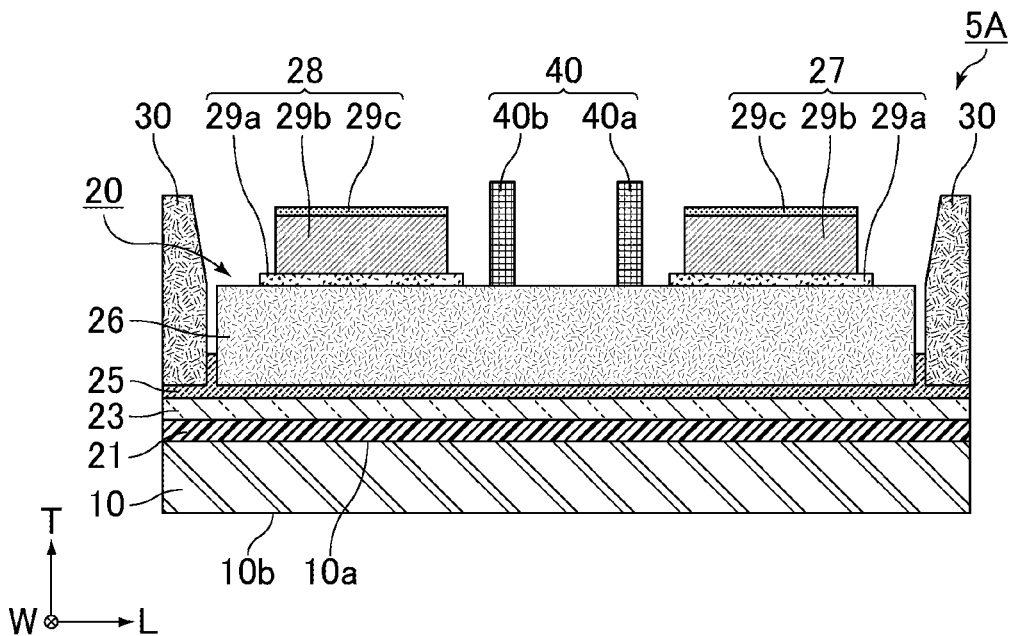
Figures 3, 14:
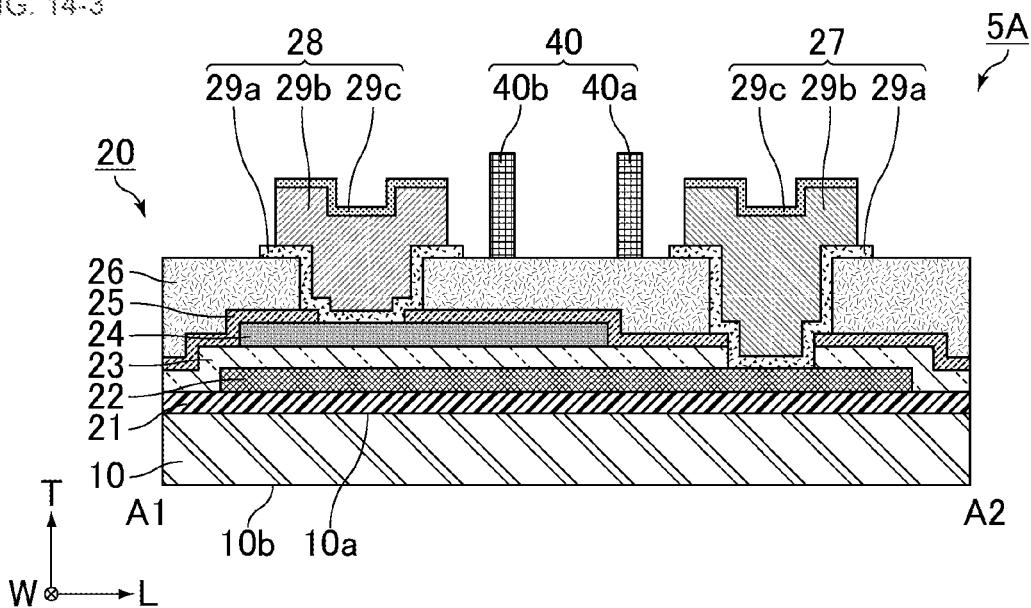

FIG. 14-1 is a schematic plan view of the capacitor according to Embodiment 5 of the present invention illustrating a modification thereof. FIG. 14-2 is a schematic side view of the capacitor illustrated in FIG. 14-1. FIG. 14-3 is a schematic sectional view of a portion corresponding to a line segment A1-A2 in FIG. 14-1.

In a capacitor 5A illustrated in FIG. 14-1, FIG. 14-2, and FIG. 14-3, the first resin body 30 and the resin protection layer 26 are separated from each other.

The first resin body 30 may be in contact with each layer of the circuit layer 20, but is preferably separated from the resin protection layer 26 as illustrated in FIG. 14-2, and is more preferably separated from the other layers of the circuit layer 20.

The Young's modulus of the first resin body 30 is preferably greater than the Young's modulus of the resin protection layer 26. In the case above, a load is less likely to be transferred to the resin protection layer 26. Specifically, it is preferable that the first resin body 30 contain a resin in a solder resist, and the resin protection layer 26 contain a polyimide resin.

In Embodiment 5 as well, the same effect as that of the Embodiment 1 may be obtained. In Embodiment 5, since the load received at the time of mounting is further less likely to be transferred to the resin protection layer 26, the load is concentrated on each of the four corners of the substrate 10 immediately below the first resin body 30. As a result, the stress applied to the end portion of the second electrode layer 24 is reduced, and the crack in the dielectric layer 23 may be prevented. Furthermore, when the first resin body 30 is separated from the resin protection layer 26, the load is less likely to be transferred to the resin protection layer 26.

Other Embodiments

The semiconductor device of the present invention is not limited to the above-described embodiments, and various applications and modifications can be made within the scope of the present invention with respect to the configuration, manufacturing conditions, and the like of the semiconductor device such as a capacitor.

For example, the semiconductor device of the present invention may include the first resin body and the third resin body without including the second resin body.

REFERENCE SIGNS LIST 1, 1A, 1B, 1C, 2, 2A, 3, 3A, 4, 5, 5A CAPACITOR (SEMICONDUCTOR DEVICE)
10 SUBSTRATE
10a FIRST MAIN SURFACE OF SUBSTRATE
10b SECOND MAIN SURFACE OF SUBSTRATE
20 CIRCUIT LAYER
21 INSULATION LAYER
22 FIRST ELECTRODE LAYER
23 DIELECTRIC LAYER
24 SECOND ELECTRODE LAYER
24a THIRD ELECTRODE LAYER
25 MOISTURE-RESISTANT PROTECTION LAYER
26 RESIN PROTECTION LAYER
27 FIRST OUTER ELECTRODE

28 SECOND OUTER ELECTRODE
29a SEED LAYER
29b FIRST PLATING LAYER
29c SECOND PLATING LAYER
30 FIRST RESIN BODY
35 PHOTOSENSITIVE RESIN FILM
40 SECOND RESIN BODY
40a FIRST WALL PORTION
40b SECOND WALL PORTION
41 THIRD RESIN BODY
50 WIRING SUBSTRATE
51 SUBSTRATE
52 FIRST LAND
53 SECOND LAND
60 SOLDER
70 MOLD RESIN
80 REGION CONNECTING END PORTIONS OF FIRST OUTER ELECTRODE AND SECOND OUTER ELECTRODE FACING EACH OTHER
100 MODULE
L LENGTH DIRECTION
T THICKNESS DIRECTION
W WIDTH DIRECTION

The invention claimed is:

1. A semiconductor device, comprising:
a substrate having a first main surface and a second main surface opposite to each other in a thickness direction;
a circuit layer on the first main surface of the substrate, wherein the circuit layer has a first electrode layer adjacent to the substrate, a second electrode layer facing the first electrode layer, a dielectric layer between the first electrode layer and the second electrode layer in the thickness direction, a first outer electrode extending to a surface of the circuit layer opposite to the substrate, and a second outer electrode extending to the surface of the circuit layer opposite to the substrate and separated from the first outer electrode;
a first resin body at each of four corners of the substrate in a plan view in the thickness direction, and wherein, in the thickness direction, a top end of the first resin body on the side opposite to the substrate is positioned higher than top ends of the first outer electrode and the second outer electrode on the side opposite to the substrate; and
a second resin body between the first outer electrode and the second outer electrode in the plan view in the thickness direction, and
wherein, in the thickness direction, a top end of the second resin body on the side opposite to the substrate is positioned higher than the top ends of the first outer electrode and the second outer electrode on the side opposite to the substrate, and is positioned higher than the top end of the first resin body on the side opposite to the substrate.

2. The semiconductor device according to claim 1, wherein the circuit layer further includes an insulation layer between the first electrode and the substrate.

3. The semiconductor device according to claim 1, wherein the circuit layer further includes a moisture-resistant protection layer covering the dielectric layer and the second electrode layer.

4. The semiconductor device according to claim 1, wherein the circuit layer further includes:
an insulation layer between the first electrode and the substrate;
a moisture-resistant protection layer covering the dielectric layer and the second electrode layer; and
a resin protection layer on the moisture-resistant protection layer.

5. The semiconductor device according to claim 1, further comprising:
a third resin body located between adjacent resin bodies of the first resin body in the plan view in the thickness direction, and
wherein, in the thickness direction, a top end of the third resin body on the side opposite to the substrate is positioned higher than the top ends of the first outer electrode and the second outer electrode on the side opposite to the substrate, and is positioned lower than the top end of the first resin body on the side opposite to the substrate.

6. The semiconductor device according to claim 1, wherein, in the plan view in the thickness direction, the first resin body is positioned so as to not overlap with the first electrode layer.

7. The semiconductor device according to claim 1, wherein the circuit layer further includes a resin protection layer covering the first electrode layer and the second electrode layer.

8. The semiconductor device according to claim 7, wherein, in the plan view in the thickness direction, the first resin body is positioned so as to not overlap with the resin protection layer.

9. The semiconductor device according to claim 8, wherein the first resin body and the resin protection layer are separated from each other.

10. The semiconductor device according to claim 1,
wherein the first outer electrode is electrically connected to the first electrode layer, and
the second outer electrode is electrically connected to the second electrode layer.

11. The semiconductor device according to claim 1,
wherein the circuit layer further includes a third electrode layer facing the first electrode layer and separated from the second electrode layer,
the first outer electrode is electrically connected to the third electrode layer, and
the second outer electrode is electrically connected to the second electrode layer.

12. The semiconductor device according to claim 1, wherein the first resin body has a shape in which the top end is thinner than a bottom portion thereof.

13. The semiconductor device according to claim 1, wherein a corner portion of the second electrode layer closest to a corner portion of the capacitor element is cut off.

14. A module, comprising:
the semiconductor device according to claim 1; and
a wiring substrate having a first land electrically connected to the first outer electrode and a second land electrically connected to the second outer electrode.

15. The module according to claim 14, further comprising:
a mold resin between the wiring substrate and each of the first outer electrode and the second outer electrode.

16. A semiconductor device comprising:
a substrate having a first main surface and a second main surface opposite to each other in a thickness direction;
a circuit layer on the first main surface of the substrate, wherein the circuit layer has a first electrode layer adjacent to the substrate, a second electrode layer facing the first electrode layer, a dielectric layer between the first electrode layer and the second electrode layer in the thickness direction, a first outer electrode extending to a surface of the circuit layer opposite to the substrate, and a second outer electrode extending to the surface of the circuit layer opposite to the substrate and separated from the first outer electrode;

a first resin body at each of four corners of the substrate in a plan view in the thickness direction, and wherein, in the thickness direction, a top end of the first resin body on the side opposite to the substrate is positioned higher than top ends of the first outer electrode and the second outer electrode on the side opposite to the substrate; and a second resin body located between adjacent resin bodies of the first resin body in the plan view in the thickness direction, and wherein, in the thickness direction, a top end of the second resin body on the side opposite to the substrate is positioned higher than the top ends of the first outer electrode and the second outer electrode on the side opposite to the substrate, and is positioned lower than the top end of the first resin body on the side opposite to the substrate.

17. A semiconductor device comprising:

a substrate having a first main surface and a second main surface opposite to each other in a thickness direction;

a circuit layer on the first main surface of the substrate, wherein the circuit layer has a first electrode layer adjacent to the substrate, a second electrode layer facing the first electrode layer, a dielectric layer between the first electrode layer and the second electrode layer in the thickness direction, a first outer electrode extending to a surface of the circuit layer opposite to the substrate, and a second outer electrode extending to the surface of the circuit layer opposite to the substrate and separated from the first outer electrode; and a first resin body at each of four corners of the substrate in a plan view in the thickness direction, and wherein, in the thickness direction, a top end of the first resin body on the side opposite to the substrate is positioned higher than top ends of the first outer electrode and the second outer electrode on the side opposite to the substrate, wherein the circuit layer further includes a resin protection layer covering the first electrode layer and the second electrode layer, and wherein a Young's modulus of the first resin body is greater than a Young's modulus of the resin protection layer.

18. The semiconductor device according to claim 17, wherein the first resin body contains a resin in a solder resist, and the resin protection layer contains a polyimide resin.

* * * * *